(12) United States Patent
Baba

(10) Patent No.: US 9,087,175 B2
(45) Date of Patent: Jul. 21, 2015

(54) INFORMATION PROCESSING APPARATUS AND DESIGN VERIFICATION METHOD

(71) Applicant: FUJITSU LIMITED, Kawasaki-shi, Kanagawa (JP)

(72) Inventor: Yuji Baba, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/180,420

(22) Filed: Feb. 14, 2014

(65) Prior Publication Data

US 2014/0289687 A1  Sep. 25, 2014

(30) Foreign Application Priority Data

Mar. 22, 2013  (JP) .................................. 2013-060954

(51) Int. Cl.
G06F 9/455 (2006.01)
G06F 17/50 (2006.01)

(52) U.S. Cl.
CPC ................................. G06F 17/5081 (2013.01)

(58) Field of Classification Search
USPC .................. 716/104, 106, 107, 111, 112, 136
See application file for complete search history.

(56) References Cited

U.S. PATENT DOCUMENTS

| 6,108,806 | A * | 8/2000 | Abramovici et al. | 714/725 |
| 6,567,966 | B2 * | 5/2003 | Miller | 716/113 |
| 6,631,487 | B1 * | 10/2003 | Abramovici et al. | 714/725 |
| 7,010,763 | B2 * | 3/2006 | Hathaway et al. | 716/132 |
| 2003/0115562 | A1 * | 6/2003 | Martin et al. | 716/5 |
| 2005/0120324 | A1 * | 6/2005 | Kanamaru | 716/18 |
| 2008/0005708 | A1 | 1/2008 | Sato et al. | |

FOREIGN PATENT DOCUMENTS

JP  07-239870  9/1995
JP  2008-009574  1/2008

* cited by examiner

*Primary Examiner* — Brian Ngo
(74) *Attorney, Agent, or Firm* — Fujitsu Patent Center

(57) ABSTRACT

A computation unit locates data of a first component in a first circuit, as well as data of a second component in the second circuit. The computation unit then obtains data of a first portion of the first circuit by tracing wiring lines from component to component in the first circuit, with the first component as the start point. Similarly the computation unit obtains data of a second portion of the second circuit by tracing wiring lines from component to component in the second circuit, with the second component as the start point. The computation unit outputs data indicating differences between the first portion and second portion, based on the obtained data of the first portion and the obtained data of the second portion.

8 Claims, 27 Drawing Sheets

FIG. 10

| RULE NUMBER | TRACE RULE TABLE | | |
|---|---|---|---|
| | TRACE RULE | | |
| | TEST ITEM | ACTION | |
| 1 | COMPONENT CLASS SYMBOL = A, B, C,... | ALLOW PASS-THROUGH | |
| 2 | COMPONENT SUBCLASS SYMBOL = a, b, c,... | ALLOW PASS-THROUGH | |
| 3 | COMPONENT PINS =< Nmax | ALLOW PASS-THROUGH | |
| 4 | COMPONENT PROCUREMENT FLAG = TRUE | ALLOW PASS-THROUGH | |
| 5 | MULTIPLE PASS-THROUGH PINS | SELECT SINGLE DESTINATION | |

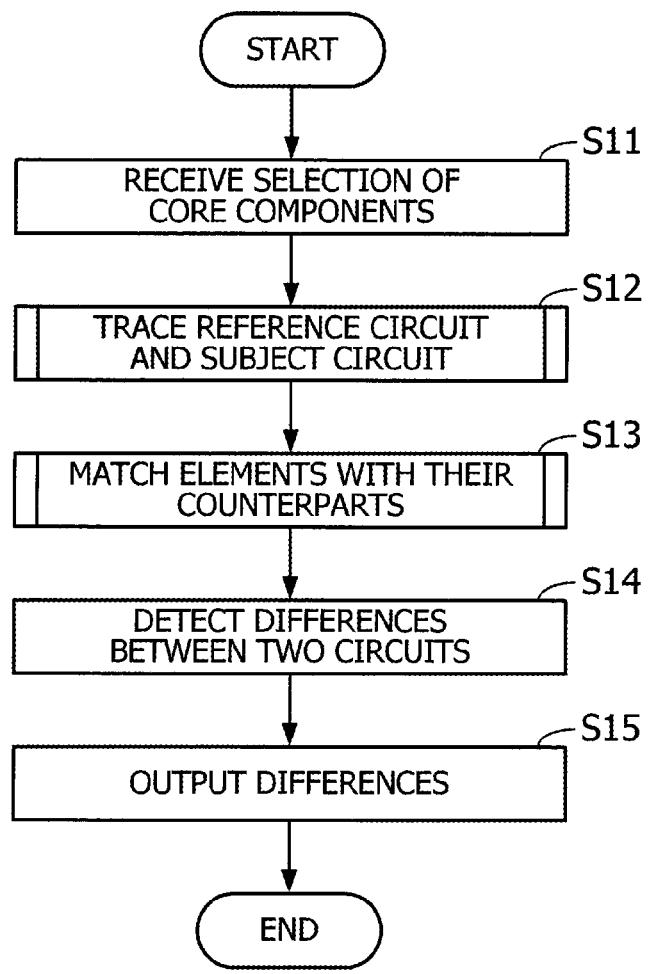

INFORMATION PROCESSING APPARATUS AND DESIGN VERIFICATION METHOD

CROSS-REFERENCE TO RELATED APPLICATION

This application is based upon and claims the benefit of priority of the prior Japanese Patent Application No. 2013-060954, filed on Mar. 22, 2013, the entire contents of which are incorporated herein by reference.

FIELD

The embodiments discussed herein relate to an information processing apparatus and a design verification method.

BACKGROUND

Electronic circuits are designed with the aid of an information processing apparatus. Generally a circuit is made up of a variety of elements, which include integrated circuits (IC), resistors, capacitors, and other electronic components. Also included are terminals for power supply and ground connections. These components are interconnected by wiring lines so that the circuit as a whole will provide particular intended functions.

Computer-aided design (CAD) is one of the tools that assist in the creation of a circuit design. CAD software running on a computer offers a graphical user interface (GUI) dedicated for circuit design. For example, the design engineer places component symbols and draws wiring lines to connect them in a GUI window on the display device.

The connections of components in a circuit may be managed by using net identifiers (net ID) assigned to each pin of components. When two or more pins have the same net ID, it means that they are wired together. The designer sometimes needs to check differences between two circuits. One proposed method achieves this by identifying each pair of corresponding pins in master and slave circuits and, with those pins, matching net IDs in the slave circuit with those in the master circuit one by one. If some net IDs remain with no counterparts, then each of these net IDs indicates a difference between the two circuits. See, for example, the following documents:

Japanese Laid-open Patent Publication No. 7-239870
Japanese Laid-open Patent Publication No. 2008-009574

The above-noted method compares two circuits in their entirety, meaning that the matching process searches even unnecessary part of the circuits. This extraneous processing could be a drawback in some cases, such as when an existing circuit is imported to the circuit under development. The design engineer may need to check the imported portion as to what is different between the existing circuit and the circuit under development. However, the processing of a whole-to-whole comparison extends over the circuit section that is unrelated to the imported circuit, thus leading to increased processing costs. Such extraneous comparison would also result in detection of extraneous differences, making it difficult to figure out which differences are really relevant.

SUMMARY

In one aspect of the embodiments, there is provided a non-transitory computer-readable storage medium storing a program which causes a computer to perform a procedure including: locating data of a first component in a first circuit, as well as data of a second component in a second circuit; obtaining data of a first portion of the first circuit by tracing wiring lines from component to component in the first circuit, with the first component as a start point; obtaining data of a second portion of the second circuit by tracing wiring lines from component to component in the second circuit, with the second component as a start point; and outputting data indicating differences between the first portion and second portion, based on the obtained data of the first portion and the obtained data of the second portion.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 10 illustrates an example of a trace rule table;
FIG. 16 is a flowchart illustrating an example of a design verification process.

DESCRIPTION OF EMBODIMENTS

Several embodiments will be described below with reference to the accompanying drawings.

(a) First Embodiment

Figure 1:
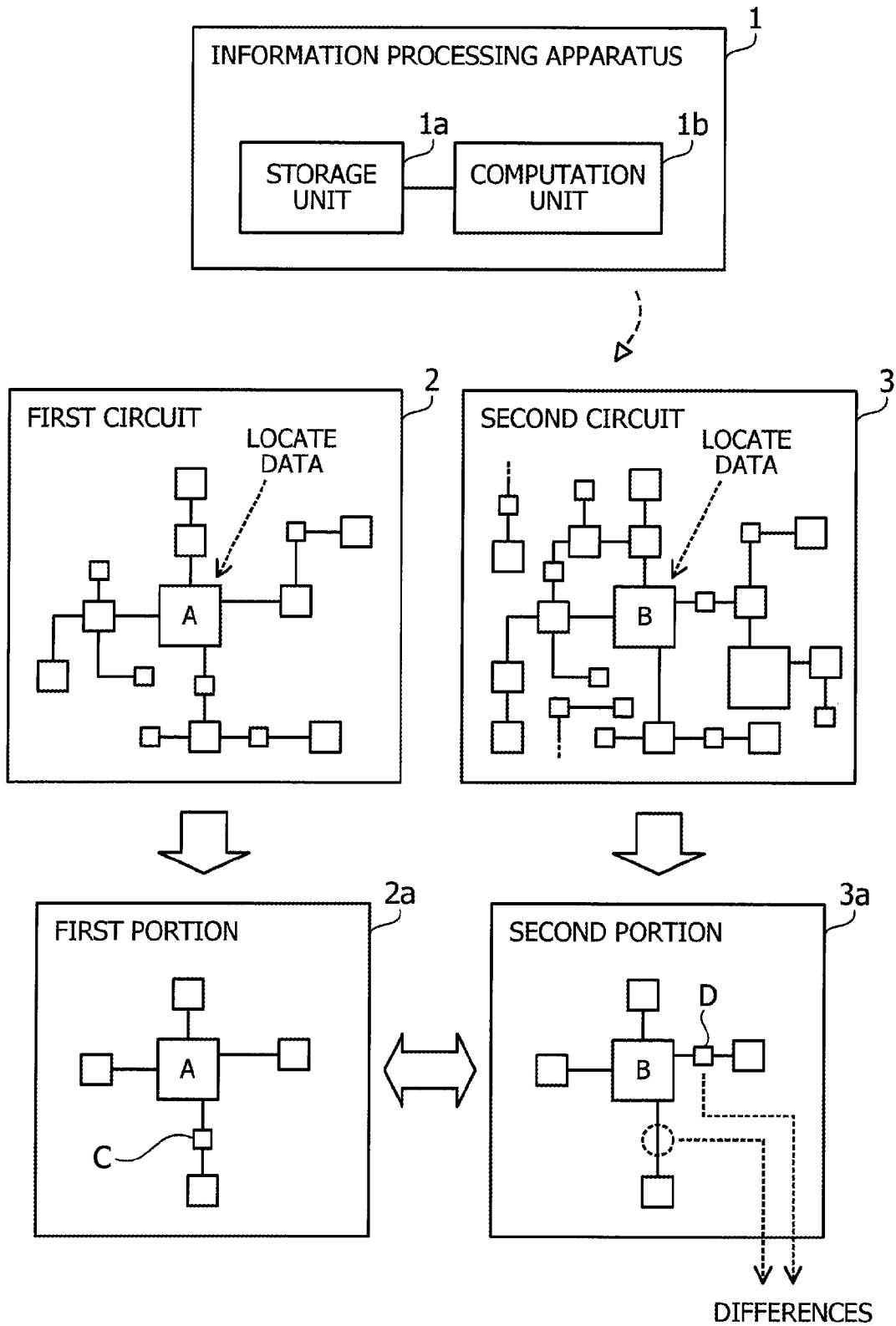
FIG. 1 illustrates an information processing apparatus according to a first embodiment.

FIG. 1 illustrates an information processing apparatus according to a first embodiment. This information processing apparatus 1 is configured to aid the user in designing electronic circuits. For example, the information processing apparatus 1 provides GUI for computer-aided circuit design.

The GUI offers a view of circuit diagrams to the user, including symbols of circuit components and lines interconnecting the symbols.

The information processing apparatus 1 includes a storage unit 1a and a computation unit 1b. The storage unit 1a may be a memory device such as random access memory (RAM). The computation unit 1b may be a processor such as central processing unit (CPU). Data processing operations described below for the first embodiment may be implemented as the functions that computation unit 1b provides by executing a software program stored in the storage unit 1a.

The storage unit 1a stores data of a first circuit 2 and a second circuit 3. The storage unit 1a also stores a set of conditions to be tested by the computation unit 1b when it traces wiring lines in a circuit. For example, the conditions may indicate whether it is allowed to pass through a component in the circuit, depending on the component's attributes. Here the phrase "pass through" denotes an act of tracing from one wiring line to another wiring line through a component that is encountered at the end of the former net.

The computation unit 1b locates data of a first component A as part of the data representing the first circuit 2. The computation unit 1b also locates data of a second component B as part of the data representing the second circuit 3. For example, the computation unit 1b may allow the user to specify a first component A in the first circuit 2. In response, the computation unit 1b locates data of the specified first component A. The computation unit 1b may similarly locate data of a second component B when the user specifies it in the second circuit 3.

Based on the trace conditions stored in the storage unit 1a, the computation unit 1b obtains data of a first portion 2a of the first circuit 2 by tracing wiring lines (nets) from component to component in the first circuit 2, with the first component A as the start point. Similarly, based on the trace conditions stored in the storage unit 1a, the computation unit 1b obtains data of a second portion 3a in the second circuit 3 by tracing wiring lines (nets) from component to component in the second circuit 3, with the second component B as the start point.

For example, the components in the first circuit 2 and second circuit 3 may be classified into three groups having different attributes. FIG. 1 distinguishes these groups by using three square symbols with different sizes. Specifically, the largest squares represent components with a first attribute. The second largest squares represent those with a second attribute. The smallest squares represent those with a third attribute. In this example, the storage unit 1a may contain the following tracing conditions: (1) When a component with the first or second attribute is reached, the computation unit 1b has to stop tracing at the component. (2) When a component with the third attribute is reached, the computation unit 1b is allowed to pass through the component.

Suppose, for example, that the computation unit 1b has located data of a first component A in the first circuit 2, as well as data of a second component B in the second circuit 3. The computation unit 1b now starts tracing wiring lines from one pin of the first component A until it reaches a component with the first or second attribute. The computation unit 1b repeats this operation with every pin of the first component A, thereby obtaining data of the first portion 2a seen in FIG. 1. Similarly the computation unit 1b starts tracing wiring lines from one pin of the second component B until it reaches a component with the first or second attribute. The computation unit 1b repeats this operation with every pin of the second component B, thereby obtaining data of the second portion 3a seen in FIG. 1.

The computation unit 1b then outputs data indicating differences between the first portion 2a and second portion 3a, based on the obtained data of the first portion 2a and the obtained data of the second portion 3a. For example, the computation unit 1b compares components and wiring lines in the first portion 2a with their respective counterparts in the second portion 3a to find differences between the two portions 2a and 3a.

More specifically, there are two differences between the first portion 2a and second portion 3a. The first difference is that the first portion 2a includes a component C, which is not present in the second portion 3a. The second difference is that the second portion 3a includes a component D, which is not present in the first portion 2a. The computation unit 1b detects these differences by matching components and wiring lines in the first portion 2a with their possible counterparts in the second portion 3a. The computation unit 1b then produces and outputs data representing the first and second differences. For example, the computation unit 1b may output data to a monitor to display the differences.

In operation of the above information processing apparatus 1, the computation unit 1b locates data of a first component A in a first circuit 2, as well as data of a second component B in a second circuit 3. From the first component A, the computation unit 1b starts tracing the wiring lines in the first circuit 2, thus obtaining data of a first portion 2a in the first circuit 2. Also, from the second component B, the computation unit 1b starts tracing the wiring lines in the second circuit 3, thus obtaining data of a second portion 3a in the second circuit 3. Based on the obtained data of the first portion 2a and second portion 3a, the computation unit 1b detects and outputs differences between the two circuit portions 2a and 3a.

In some circumstances described below, the above method finds differences between two circuits more efficiently than comparing the circuits in their entirety, including unnecessary portions. Suppose, for example, that the design engineer imports some part of an existing circuit into the circuit that he or she is developing. The former circuit corresponds to the first circuit 2 and the latter circuit the second circuit 3 in this case. The design engineer may need to check whether the resulting second circuit 3 has any differences from the original first circuit 2, particularly with respect to the imported portion. However, the processing of a whole-to-whole comparison between the first circuit 2 and second circuit 3 extends over the circuit section that is unrelated to the imported circuit, thus leading to increased processing costs. This extraneous comparison also results in detection of extraneous differences, making it difficult for the design engineer to figure out which differences are really relevant.

In view of the above, the proposed information processing apparatus 1 is configured to find a first portion 2a and a second portion 3a for comparison by searching data of a given first circuit 2 and second circuit 3 from particular components specified and located as the start point. This feature avoids extraneous comparison in the first circuit 2 and second circuit 3.

The first portion 2a is a part of the first circuit 2 that the computation unit 1b has demarcated by tracing wiring lines from a first component A. Likewise, the second portion 3a is a part of the second circuit 3 that the computation unit 1b has demarcated by tracing wiring lines from a second component B. In contrast, a more simple method is to extract components and wiring lines from a circular area with a predetermined radius (or a polygonal area with predetermined side lengths) around the second component B in the second circuit 3. This alternative method, however, may extract extra elements not connected to the second component B directly or indirectly, which results in extraneous comparison of elements. The first embodiment is therefore configured to trace wiring lines from the first component A and second component B to extract a first portion 2a and second portion 3a for the purpose of comparison. The extracted elements in the first portion 2a are connected directly or indirectly to the first component A. This is also true to the second portion 2a and second component B.

As can be seen from the above, the present embodiment makes a focused comparison of circuits and is thus able to avoid unnecessary detection of differences. In other words, it is less likely that the user is overwhelmed by a large number of differences that are detected. Accordingly the present embodiment aids the user to review the differences in a particular portion of the circuits.

The present embodiment may allow the user to select components from among those in the first circuit 2 and second circuit 3, so that a comparison will be made on the circuit portions around the selected components. In this way, the information processing apparatus 1 narrows down the scope of comparison as desired by the user and effectively aids him or her in verifying a circuit design.

(b) Second Embodiment

Figure 2:
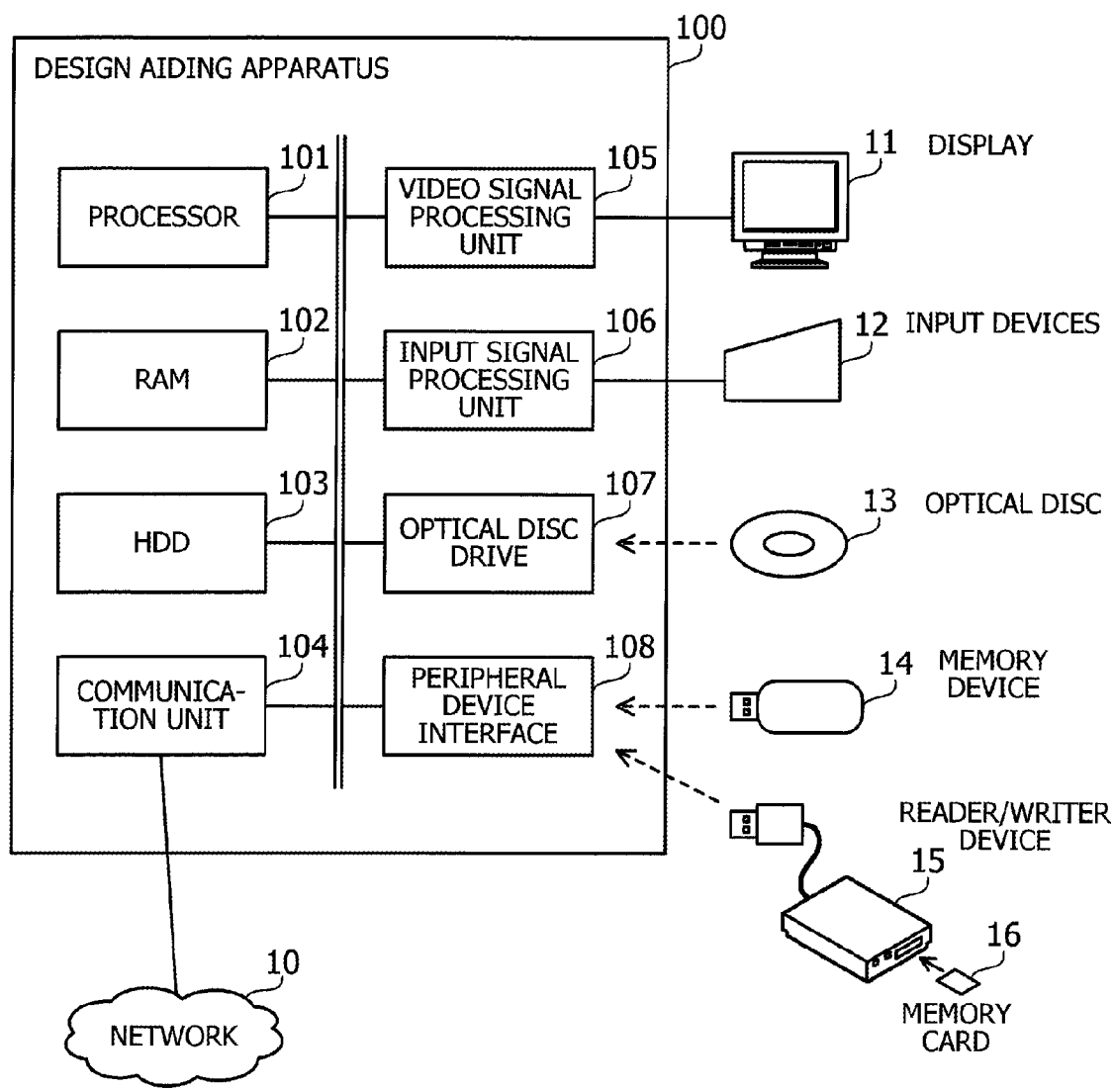
FIG. 2 illustrates an example of hardware configuration of a design aiding apparatus according to a second embodiment.

FIG. 2 illustrates an example of hardware configuration of a design aiding apparatus according to a second embodiment. The illustrated design aiding apparatus 100 is a computer configured to aid engineers in the design of electronic circuits. The design aiding apparatus 100 may provide CAD functions. The design aiding apparatus 100 includes a processor 101, a RAM 102, a hard disk drive (HDD) 103, a communication unit 104, a video signal processing unit 105, an input signal processing unit 106, an optical disc drive 107, and a peripheral device interface 108. These components are connected together via a bus in the design aiding apparatus 100.

The processor 101 controls data processing operations in the design aiding apparatus 100. This processor 101 may actually be a single processor or a system of multiple processors. For example, the processor 101 may be implemented with a CPU, micro processing unit (MPU), digital signal processor (DSP), application specific integrated circuit (ASIC), field-programmable gate array (FPGA), programmable logic device (PLD), or any of their combinations.

The RAM 102 serves as primary storage of the design aiding apparatus 100. Specifically, the RAM 102 is used to temporarily store at least some of the operating system (OS) programs and application programs that the processor 101 executes, in addition to other various data objects that it manipulates at runtime.

The HDD 103 serves as secondary storage of the design aiding apparatus 100. Specifically, the HDD 103 writes and reads data magnetically on its internal platters to store program and data files of the operating system and applications. The design aiding apparatus 100 may include a plurality of non-volatile storage devices such as flash memories and solid state drives (SSD) in place of, or together with the HDD 103.

The communication unit 104 is an interface for the processor 101 to communicate with other computers (not illustrated) via a network 10. The communication unit 104 may be a wired network interface or a radio network interface.

The video signal processing unit 105 produces video images in accordance with commands from the processor 101 and outputs them on a display 11 coupled to the design aiding apparatus 100. The display 11 may be, for example, a cathode ray tube (CRT) display or a liquid crystal display.

The input signal processing unit 106 receives input signals from input devices 12 attached to the design aiding apparatus 100 and supplies these signals to the processor 101. The input devices 12 include, for example, a keyboard and a pointing device such as mouse and touchscreen.

The optical disc drive 107 is a device used to read program files and data files stored in an optical disc 13 by using laser light or the like. The optical disc 13 may include, for example, digital versatile disc (DVD), DVD-RAM, compact disc read-only memory (CD-ROM), CD recordable (CD-R), and CD rewritable (CD-RW). The optical disc drive 107 transfers programs and data read out of such an optical disc 13 to, for example, the RAM 102 or HDD 103 according to commands from the processor 101.

The peripheral device interface 108 is a communication interface used to connect peripheral devices to the design aiding apparatus 100. For example, a memory device 14 and a reader/writer device 15 may be connected to the peripheral device interface 108. The memory device 14 is a data storage medium with a capability of communicating with the peripheral device interface 108. The reader/writer device 15 is an adapter used to write data to or read data from a memory card 16, which is a data storage medium in the form of a small card. The peripheral device interface 108 transfers programs and data read out of the memory device 14 or memory card 16 to the RAM 102 or HDD 103 according to commands from the processor 101.

The design aiding apparatus 100 extracts differences between two circuit diagrams and provides the result to the user for the following purposes. In product development, using an existing circuit design is faster than creating a circuit from scratch. It is therefore a common approach to import an existing reference circuit as part of the circuit of a product under design so as to reduce the time and labor for the product development. The noted feature of the design aiding apparatus 100 may be used to compare a circuit diagram of a reference circuit with that of a product circuit under development. The comparison permits the user to understand which components are added to or removed from the reference circuit when it is incorporated into the product circuit. With the provided information, the user reviews whether his or her circuit operates properly with the imported circuit, since the user is aware of a potential danger of adding or removing components that would heavily affect the circuit's operation. This review is an important part of the circuit design process because adding needless elements or removing indispensable elements would lead to a defect of the final product.

The second embodiment is thus proposed to support comparison between a reference circuit and another circuit into which the reference circuit has been imported. Where appropriate, the following description may refer to the latter circuit as the "subject circuit."

Figure 3:
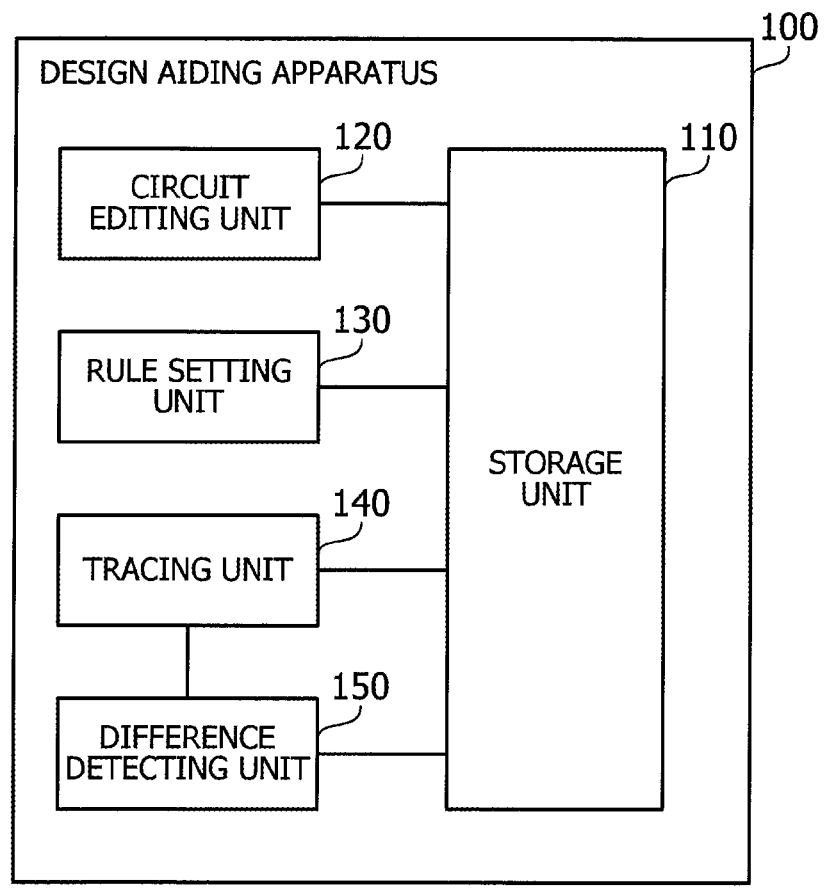
FIG. 3 illustrates an example of software modules in the design aiding apparatus.

FIG. 3 illustrates an example of software modules in the design aiding apparatus 100. The modules seen in FIG. 3 may be implemented wholly or partly with computer programs that the processor 101 executes on the RAM 102. Specifically, the illustrated design aiding apparatus 100 includes a storage unit 110, a circuit editing unit 120, a rule setting unit 130, a tracing unit 140, and a difference detecting unit 150.

For processing by the illustrated modules, the storage unit 110 stores various data objects including the following three kinds of data. First, the storage unit 110 stores circuit data representing electronic circuits. Second, trace rules are stored to define the conditions for extracting part of a circuit from its circuit data. Third, the storage unit 110 stores matching rules that specify how to correlate extracted circuits.

The circuit editing unit 120 produces a GUI window on the display 11 to aid the user's circuit design. Specifically the circuit editing unit 120 accepts edit commands from the user through input devices 12 and modifies the circuit data accordingly. For example, the circuit editing unit 120 may add new components and wiring lines to the circuit data or remove existing ones from the circuit data.

The rule setting unit 130 interacts with the user to help him or her edit trace rules and matching rules. Specifically the rule setting unit 130 updates the trace rules and matching rules stored in the storage unit 110 in accordance with editing commands received from the user.

The tracing unit 140 allows the user to select circuit data of two circuits to be contrasted (i.e., reference circuit and subject circuit). The tracing unit 140 also accepts the user's choice of a component, one for each circuit, as the start point of tracing. These start-point components are referred to as "core components."

The term "tracing" denotes extracting part of given circuit data while following the paths of wiring lines from a core component. Using the trace rules stored in the storage unit 110, the tracing unit 140 extracts data of a circuit within a traced range around a specified core component. The tracing unit 140 performs this for each of the two circuits and their respective core components, thus obtaining two sets of partial circuit data.

The difference detecting unit 150 compares the two sets of partial circuit data obtained by the tracing unit 140, thereby detecting their differences. The difference detecting unit 150 then outputs the detection result on a screen of the display 11.

Figure 4:
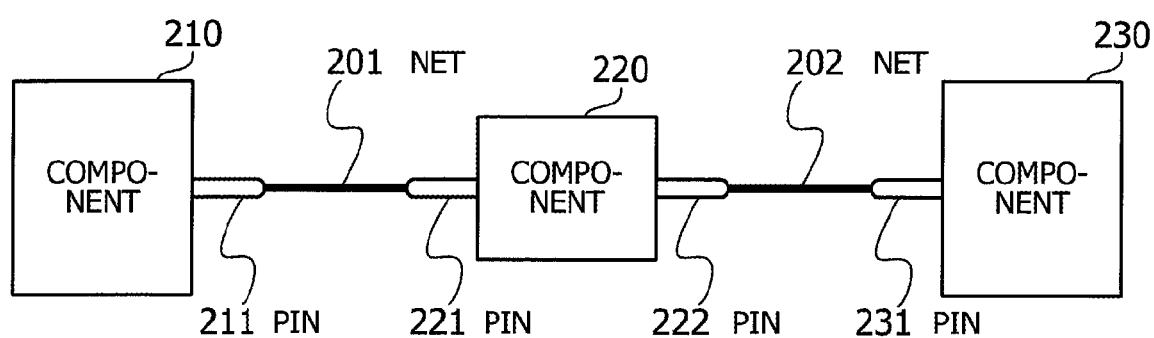
FIG. 4 illustrates an example of a circuit diagram.

FIG. 4 illustrates an example of a circuit diagram. This circuit diagram 200 includes nets 201 and 202, components 210, 220, and 230, and pins 211, 221, 222, and 231. The nets 201 and 202 are wiring lines interconnecting components. The presence of such a net between two components in the circuit data means that these components will be electrically connected when they are implemented in a physical circuit. The components 210, 220, and 230 may be electronic devices such as ICs, resistors, and capacitors, or may be terminals for power supply and ground.

Pins 211, 221, 222, and 231 are terminals of the components. A net is formed by connecting one pin to another pin. Specifically, one pin 211 belongs to the leftmost component 210 in FIG. 4. Another pin 231 belongs to the rightmost component 230. Pins 221 and 222 belong to the middle component 220. The wiring line between two pins 211 and 221 forms a net 201. In other words, the pins 211 and 221 belong to the net 201. The wiring line between two pins 222 and 231 forms another net 202. In other words, the pin 222 and 231 belong to the net 202.

The above example illustrates two pins belonging to one net. It is also possible that three or more pins belong to one net. In this case, the wiring line has two or more branches to connect multiple pins. As seen from the example of FIG. 4, a circuit diagram is represented as a collection of nets, components, and pins. The design aiding apparatus 100 manages such circuit diagrams in the form of circuit data described below.

Figure 5:
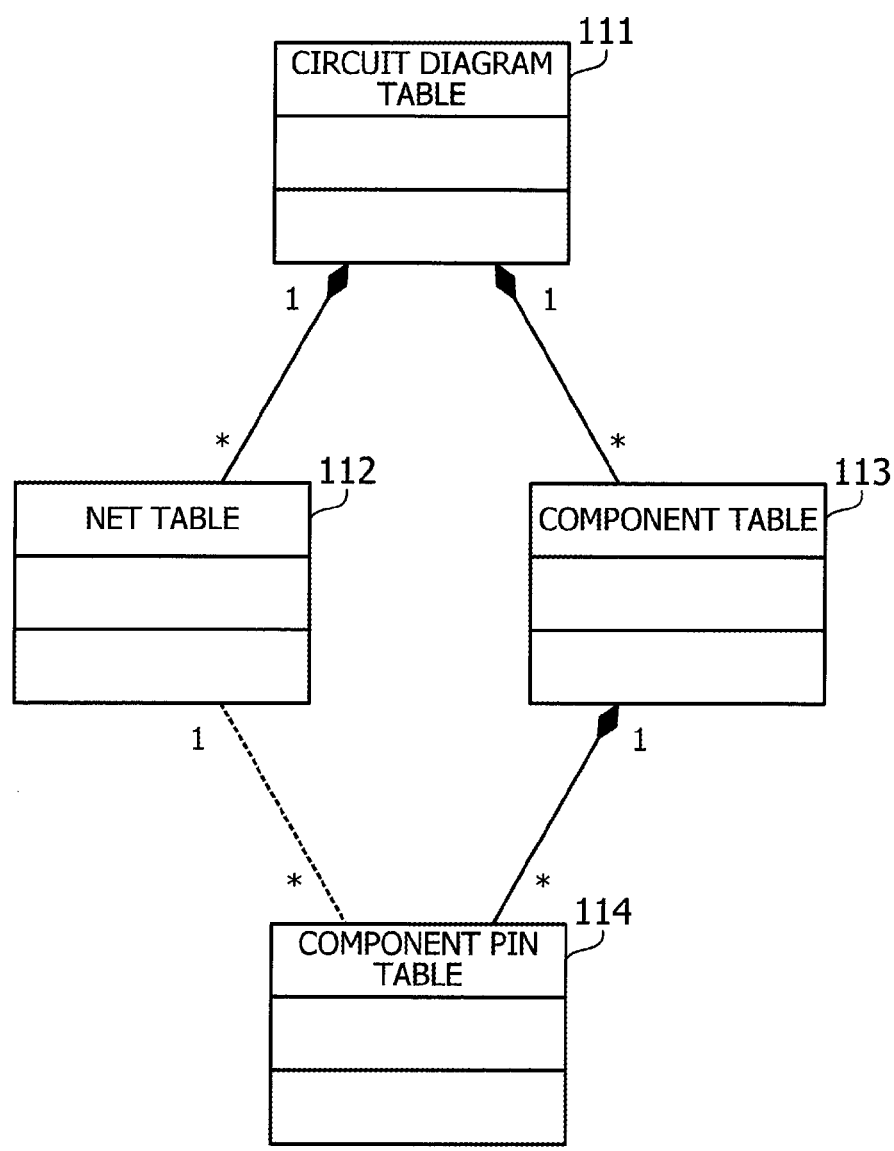
FIG. 5 illustrates an example of circuit data.

FIG. 5 illustrates an example of circuit data stored in the storage unit 110. The illustrated circuit data includes a circuit diagram table 111, a net table(s) 112, a component table(s) 113, and a component pin table(s) 114. FIG. 5 depicts how these tables are associated, following the notation of Unified Modeling Language (UML).

While only one net table 112 is seen if FIG. 5, the circuit diagram table 111 may be associated with two or more such net tables 112 (the asterisk * in FIG. 5 denotes multiple instances). This means that a plurality of nets may belong to a single circuit diagram. Similarly, there may be two or more component tables 113 associated with a single circuit diagram table 111. That is, a plurality of components may belong to a single circuit diagram. Also, one net table 112 may be associated with two or more component pin tables 114, meaning that a plurality of component pins may belong to a single net. Further, one component table 113 may be associated with two or more component pin tables 114, meaning that a plurality of component pins may belong to a single component.

Figure 6:
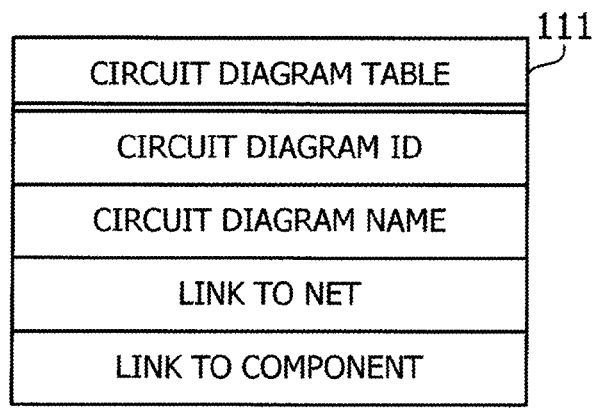
FIG. 6 illustrates an example of a circuit diagram table.

FIG. 6 illustrates an example of a circuit diagram table. The illustrated circuit diagram table 111 is formed from the following data fields: "Circuit Diagram ID," "Circuit Diagram Name," "Link to Net," "Link to Component." The circuit diagram ID field contains an identifier that uniquely identifies a particular circuit diagram, and the circuit diagram name field gives a distinguishing name of that circuit diagram. The link-to-net field contains a pointer that points to a net table 112 associated with the circuit diagram table 111. When two or more nets belong to the circuit diagram, the link-to-net field contains a plurality of pointers for such nets. The link-to-component field contains a pointer that points to a component table 113 associated with the circuit diagram table 111. When two or more components belong to the circuit diagram, the link-to-component field contains a plurality of pointers for such components.

Figure 7:
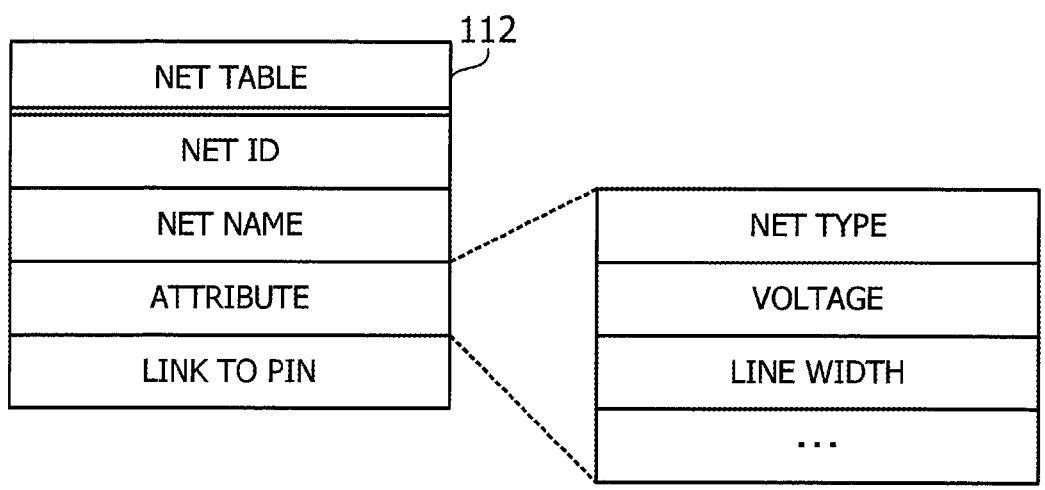
FIG. 7 illustrates an example of a net table.

FIG. 7 illustrates an example of a net table. The illustrated net table 112 is formed from the following data fields: "Net ID," "Net Name," "Attribute," and "Link to Pin." The net ID field contains an identifier that uniquely identifies a particular net, and the net name field gives a distinguishing name of that net. The attribute field contains various attributes of the net, such as net type, voltage value, line width, and so on. The net type attribute indicates for what purpose the net is routed. For example, a net may be a signal line or power supply line or ground line. The voltage value attribute specifies a voltage (e.g., +3.3 V, −2.5 V) to be applied to the wiring line. The line width attribute gives the width (e.g., 2 mm, 1 mm) of the wiring line. The link-to-pin field contains a pointer that points to a component pin table 114 associated with the net table 112. When two or more pins belong to the net, the link-to-pin field contains a plurality of pointers for such pins.

Figure 8:
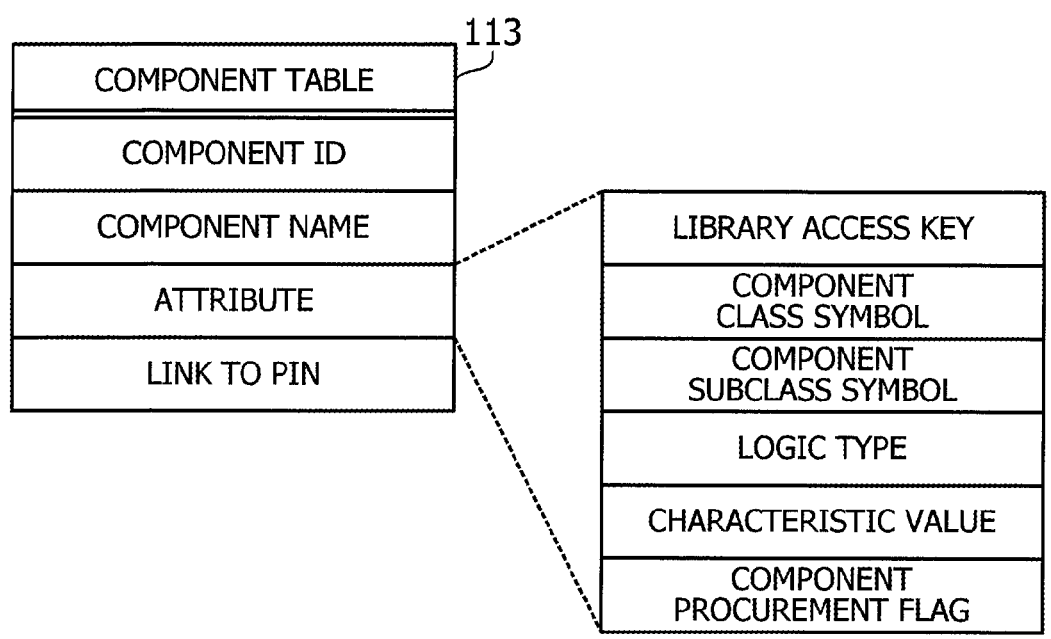
FIG. 8 illustrates an example of a component table.

FIG. 8 illustrates an example of a component table. The illustrated component table 113 is formed from the following data fields: "Component ID," "Component Name," "Attribute," and "Link to Pin." The component ID field contains an identifier that uniquely identifies a particular component, and the component name field gives a distinguishing name of that component. The attribute field contains various attributes of the component, which include, for example, library access key, component class symbol, component subclass symbol, logic type, characteristic value, and component procurement flag. The details of these attributes are as follows.

Library access keys serve as the identifiers for registration and management of components in a component database. The component database manages a collection of components separately from circuit data. A library access key uniquely identifies a particular component in the component database. The component database may be stored locally in the storage unit 110 or the like or may be located in a remote computer connected to the design aiding apparatus 100 via a network.

Component class symbols are previously defined to classify the components. For example, the symbols "R" and "C" represent the resistor class and capacitor class, respectively. Component subclass symbols complement the component class symbols to provide further classification with a finer granularity. Any appropriate symbols may be used to represent subclasses. For example, the symbol "RA" denotes a subclass of "resistor type A," and the symbol "CA" denotes a subclass of "capacitor type A." The user may be allowed to define such component subclass symbols as desired, depending on what sub-classification he or she intends to manage.

Logic types are defined primarily for resistors and capacitors. For example, resistors may have a logic type attribute of "dumping resistor," "pull-up resistor," or the like. Characteristic values represent particular characteristics of each particular component, such as resistance and capacitance. In the case of resistors, a specific value of electrical resistance (e.g., 10.0Ω) is registered. In the case of capacitors, a specific value of capacitance (e.g., 30.0 F) is registered. Component procurement flag is used to control whether to place purchase orders of a particular component for the purpose of manufacturing in the factory. Specifically the component procurement flag is set to "true" when a purchase order is to be placed. Otherwise, the component procurement flag is set to "false."

Referring again to the component table 113, the link-to-pin field contains a pointer that points to a component pin table 114 associated to the component table 113. When two or more pins belong to the component, the link-to-pin field contains a plurality of pointers for such component pins.

Note that each component is associated with a piece of data for displaying its symbol on a GUI window. This data may be referred to as the "component symbol data." For example, a set of component symbol data may be stored previously in the component database. The component symbol data may be associated with a library access key, in which case the tracing unit 140 gains access to the component symbol data by using the library access key. In addition to the symbols, the component symbol data also includes information indicating the number of pins, and their layout, of each component.

Figure 9:
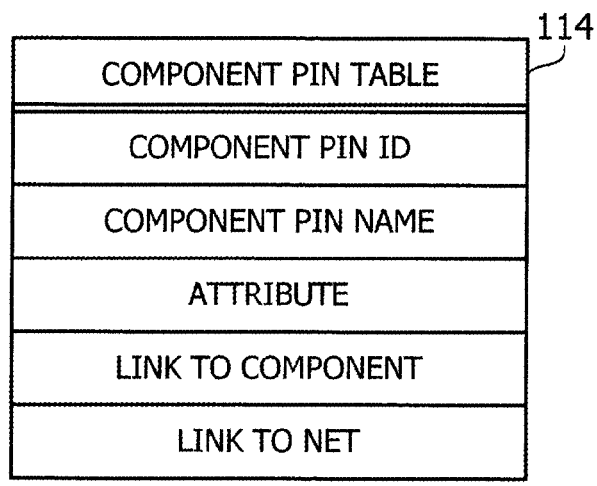
FIG. 9 illustrates an example of a component pin table.

FIG. 9 illustrates an example of a component pin table. The illustrated component pin table 114 is formed from the following data fields: "Component Pin ID," "Component Pin Name," "Attribute," "Link to Component," and "Link to Net." The component pin ID field contains an identifier that uniquely identifies a particular component pin. The component pin name field gives a distinguishing name of that pin. The attribute field contains various attributes of the pin. The link-to-component field contains a pointer that points to a component table 113 associated to the component pin table 114. The link-to-net field contains a pointer that points to a net table 112 associated with the component pin table 114.

FIG. 10 illustrates an example of a trace rule table stored in the storage unit 110. Each record registered in the illustrated trace rule table 115 is formed from the following data fields: "Rule Number" and "Trace Rule." The rule number field contains a number that identifies the record itself. The trace rules field gives substantive content of a trace rule, which is divided into two subfields named "Test Item" and "Action." The test item subfield describes what is tested when tracing circuit data. The action subfield specifies what to do when its corresponding test item is found to be true.

For example, the topmost record of the trace rule table 115 in FIG. 10 is identified by a rule number of "1" and contains a test item that reads "Component class symbol=A, B, C, . . . " and an action that reads "Allow pass-through." This trace rule No. 1 permits the tracing unit 140 to pass through an encountered component to expand the trace range when the component class symbol of that component is among the given list of symbols "A, B, C, . . . "

The term "pass-through" refers to the act of tracing through a component that is encountered at the end of a net that is traced, so that another net beyond the component will be included in the trace range. Some components permit this pass-through tracing, while other components do not. When a component in the latter group is extracted at the end of some net, the tracing unit 140 does not go beyond the component even if there are further nets extending from the component. In other words, such a non-pass-though component terminates the tracing at one end point.

The second record of the trace rule table 115 is identified by a rule number of "2" and contains a test item that reads "Component subclass symbol=a, b, c, . . . " and an action that reads "Allow pass-through." This trace rule No. 2 permits the tracing unit 140 to pass through an encountered component to expand the trace range when the component subclass symbol of that component is among the given list of "a, b, c, . . . "

The third record of the trace rule table 115 is identified by a rule number of "3 " and contains a test item that reads "Component pins=<Nmax" and an action that reads "Allow pass-through." This trace rule No. 3 permits the tracing unit 140 to pass through an encountered component to expand the trace range when the number of pins of that component is smaller than or equal to Nmax, where Nmax is a predetermined integer greater than one.

The fourth record of the trace rule table 115 is identified by a rule number of "4" and contains a test item that reads "Component Procurement Flag=True" and an action that reads "Allow pass-through." This trace No. 4 rule permits the tracing unit 140 to pass through an encountered component to expand the trace range when the component procurement flag of that component is set to true.

The fifth record of the trace rule table 115 is identified by a rule number of "5" and contains a test item that reads "Multiple pass-through pins" and an action that reads "Select single destination." This trace rule No. 5 means that the tracing unit 140 is not allowed to select a plurality of pins for pass-through tracing (referred to as the "pass-through pins") even when there are two or more other nets beyond the encountered component. In other words, the tracing unit 140 is only allowed to select a single pin to execute the pass-through tracing.

What is described above is only an example of trace rules. The trace rule table 115 may contain other test items and other actions. For example, one possible trace rule record may define a test item of "Starting pin is connected to another pin via an intermediate component (component ID "X")" and an action of "Allow pass-through." This trace rule allows the tracing unit 140 to pass through an encountered component to expand the trace range when the starting pin of the tracing is connected with a pin of some other component via a component with an ID of "X."

It is also noted that the trace rules Nos. 1 to 4 in the trace rule table 115 may be tested as AND conditions. That is, the tracing unit 140 is allowed to pass through a component only when all those test items are found to be true for that component. In this way, multiple conditions may be cascaded to determine whether to go beyond a component, thus limiting the effective range of the pass-through tracing. Alternatively, the trance rules Nos. 1 to 4 may be tested as OR conditions. That is, the tracing unit 140 is allowed to pass through a component when at least one of the four test items is found to be true for that component.

The next section of this description will describe an example of trace data for managing partial circuits obtained by the tracing discussed above. Trace data is stored in the storage unit 110 and includes four kinds of tables described below. First, a plurality of trace map (TM) tables are produced, one for each core component. Second, a plurality of trace pin map (TPM) tables are produced, one for each component pin of core components. Third, a plurality of trace path (TP) tables are produced, one for each net. Fourth, a plurality of pin data (PD) tables are produced, one for each component pin belonging to the nets.

Figure 11:
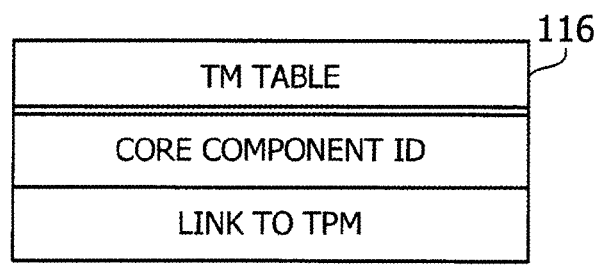
FIG. 11 illustrates an example of a TM table.

FIG. 11 illustrates an example of a TM table. The illustrated TM table 116 is formed from the following data fields: "Core Component ID" and "Link to TPM." The core component ID field contains a component ID that indicates a particular core component. This core component ID may be regarded as a subtype of the component ID. The link-to-TPM field contains a pointer that points to a TPM table associated with the TM table 116. That is, this pointer is directed to a TPM table for a particular pin of the core component. When two or more TPM tables are associated with this TM table 116, the link-to-TPM field contains a plurality of pointers for such TPM tables.

Figure 12:
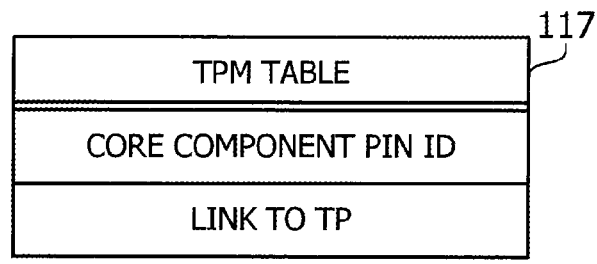
FIG. 12 illustrates an example of a TPM table.

FIG. 12 illustrates an example of a TPM table. The illustrated TPM table 117 is formed from the following data fields: "Core Component Pin ID" and "Link to TP." The core component pin ID field contains a component pin ID that indicates a particular pin of the core component. This core component pin ID may be regarded as a subtype of the component pin ID. The link-to-TP field contains a pointer that points to a TP table belonging to the TPM table 117. When two or more TP tables belong to the TPM table 117, the link-to-TP field contains a plurality of pointers for such TP tables.

Figure 13:
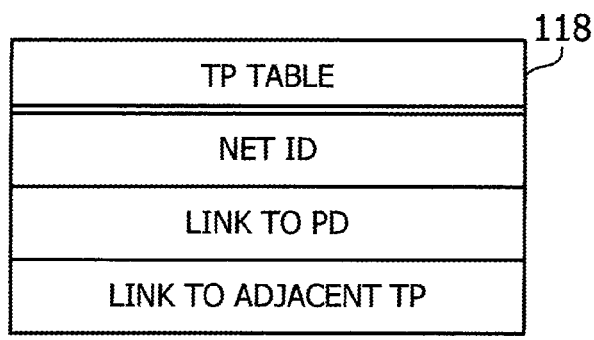
FIG. 13 illustrates an example of a TP table.

FIG. 13 illustrates an example of a TP table. The illustrated TP table 118 is formed from the following data fields: "Net ID," "Link to PD," and "Link to Adjacent TP." The net ID field contains a net ID indicating a particular net that the TP table 118 represents, and the link-to-PD field contains a pointer that points to a PD table of a component constituting that particular net. Since one net interconnects two or more components, the link-to-PD field contains a plurality of such pointers to their corresponding PD tables. The link-to-adjacent-TP field contains a pointer that points to another TP table that represents a net adjacent to the net indicated by the TP table 118. The TP table of an adjacent net is referred to as the "adjacent TP table." When there are two or more such adjacent nets, the link-to-adjacent-TP field contains a plurality of pointers for those nets. Note that two nets are said to be "adjacent" when there is a single intervening component between the two nets, and only when that intervening component allows the foregoing pass-through tracing.

Figure 14:
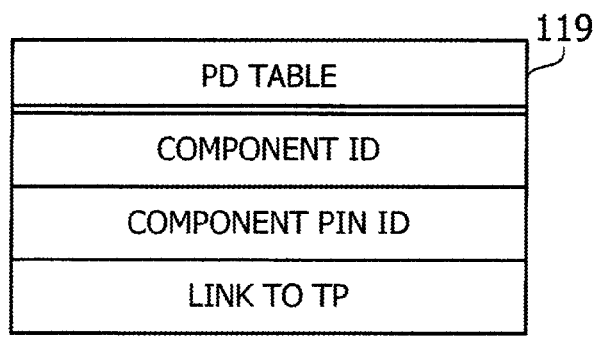
FIG. 14 illustrates an example of a PD table.

FIG. 14 illustrates an example of a PD table. The illustrated PD table 119 is formed from the following data fields: "Component ID," "Component Pin ID," and "Link to TP." The component ID field contains a component ID that indicates a particular component, and the component pin ID field contains a component pin ID that indicates a particular component pin of that component. The link-to-TP field contains a pointer that points to a TP table of a net to which the component pin belongs. In this way, the PD table 119 is associated with a particular component pin and a particular component. In the case of a component having two or more pins, the single component is associated with a plurality of PD tables, one for each pin.

Figure 15A:
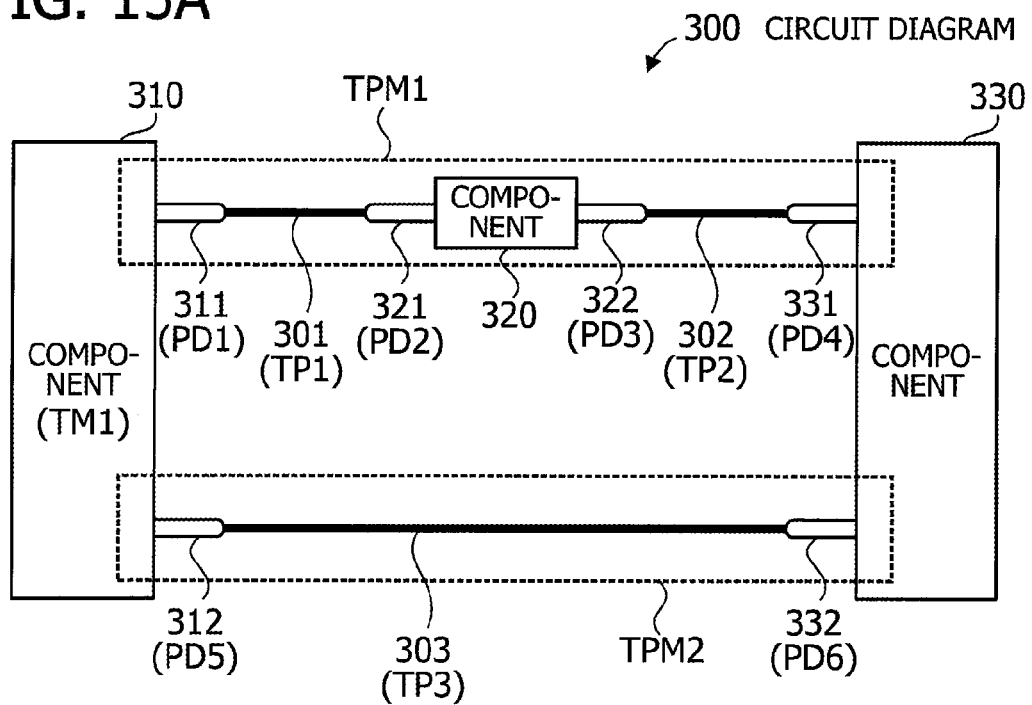
FIGS. 15A and 15B illustrate an example of trace data.
Figure 15B:
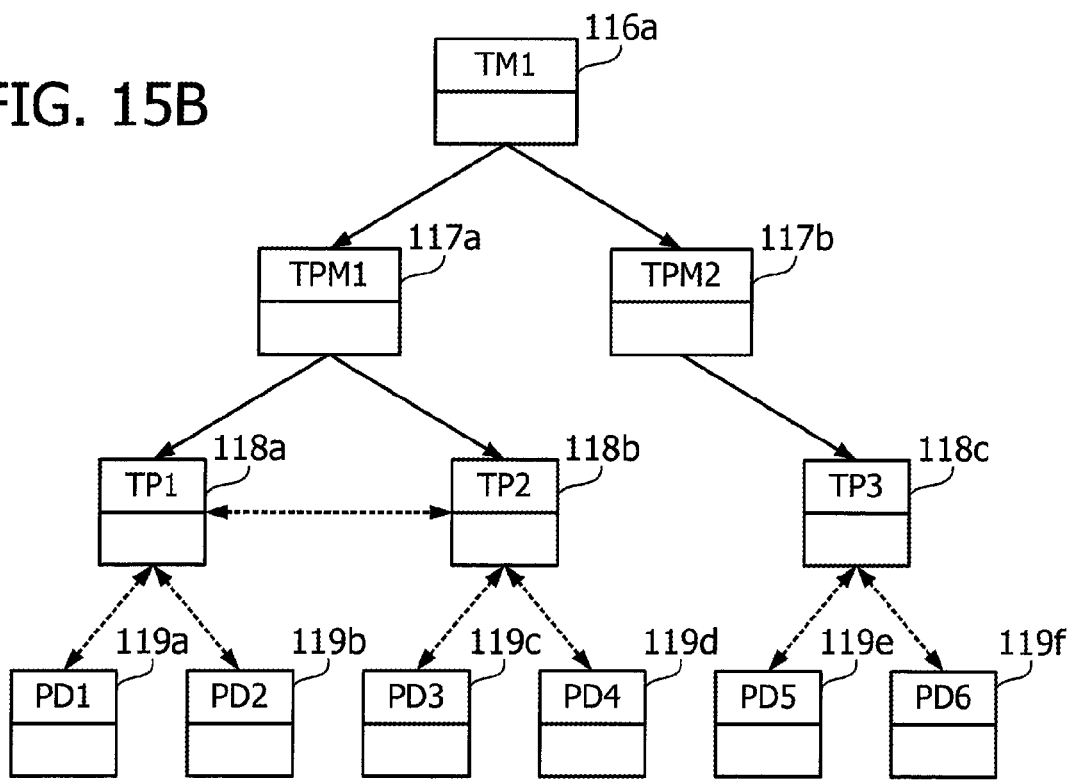

FIGS. 15A and 15B illustrate an example of trace data. Specifically, FIG. 15A exemplifies a circuit diagram 300 corresponding to the trace data of FIG. 15B. The circuit diagram 300 includes nets 301, 302, and 303, components 310, 320, and 330, and component pins 311, 312, 321, 322, 331, and 332. FIG. 15A also includes several additional names of these elements, together with their reference numerals, which will be used later in the description of FIG. 15B.

The leftmost component 310 in FIG. 15A has two pins 311 and 312. The middle component 320 has two pins 321 and 322. It is assumed that this component 320 permits pass-through tracing. The rightmost component 330 has two pins 331 and 332. It is assumed that this component 330 does not permit pass-through tracing. Component pins 311 and 321 belong to one net 301. Component pins 322 and 331 belong to another net 302. Component pins 312 and 332 belong to yet another net 303.

FIG. 15B exemplifies trace data obtained by tracing the circuit diagram 300 from the core component 310. The trace data is in the form of a tree structure, at the root of which a TM table 116a is placed to indicate the core component 310. FIG. 15B uses a symbol "TM1" to represent this root component 310, from which the tracing process starts.

Since the core component 310 has two pins 311 and 312, the TM table 116a contains two pointers, one pointing to a TPM table 117a indicating the former component pin 311, and the other pointing to another TPM table 117b indicating the latter component pin 312.

As noted above, the TPM table 117a corresponds to one component pin 311 of the core component 310. This TPM table 117a indicates a set TPM1 of all nets traceable from the component pin 311. As seen in the example of the circuit diagram 300, two nets 301 and 302 belong to TPM1. Accordingly the TPM table 117a includes two pointers in its link-to-TP field, one pointing to a TP table 118a indicating the former net 301 and the other pointing to another TP table 118b indicating the latter net 302.

The TPM table 117b corresponds to the other component pin 312 of the core component 310. This TPM table 117b indicates a set TPM2 of all nets traceable from the component pin 312. Since the net 303 is the only net that belongs to TPM2 in the example of the circuit diagram 300, the TPM table 117b includes in its link-to-TP field one pointer pointing to a TP table 118c representing the net 303.

As noted above, the TP table 118a corresponds to one net 301 in TPM1, which is seen as TP1 in FIG. 15B. The net 301 runs between component pins 311 and 321 in the circuit diagram 300. Accordingly the TP table 118a contains two pointers in its link-to-PD field, one pointing to a PD table 119a indicating the former component pin 311 and the other pointing to a PD table 119b indicating the latter component pin 321. As seen from the circuit diagram 300, the net 301 is adjacent to another net 302 via an intervening component 320. The TP table 118a thus contains in its link-to-adjacent-TP field a pointer that points to another TP table 118b representing the adjacent net 302.

The TP table 118b corresponds to the other net 302 in TPM1, which is seen as TP2 in FIG. 15B. The net 302 runs between component pins 322 and 331 in the circuit diagram 300. Accordingly the TP table 118b contains two pointers in its link-to-PD field, one pointing to a PD table 119c indicating the former component pin 322 and the other pointing to a PD table 119d indicating the latter component pin 331. As noted above, the nets 301 and 302 are adjacent to each other. The TP table 118b thus contains in its link-to-adjacent-TP field a pointer to another TP table 118a representing the adjacent net 301.

The TP table 118c corresponds to the net 303 in TPM2, which is seen as TP3 in FIG. 15B. The net 303 runs between component pins 312 and 332 in the circuit diagram 300. Accordingly the TP table 118c contains two pointers in its link-to-PD field, one pointing to a PD table 119e representing the former component pin 312 and the other pointing to a PD table 119f representing the latter component pin 332.

The leftmost PD table 119a in FIG. 15B represents a component pin 311 (PD1), and its link-to-TP field contains a pointer to the TP table 118a. The next PD table 119b in FIG.

15B represents another component pin 321 (PD2), and its link-to-TP field contains a pointer to the TP table 118a.

The next PD table 119c in FIG. 15B represents a component pin 322 (PD3), and its link-to-TP field contains a pointer to the TP table 118b. The next PD table 119d in FIG. 15B represents a component pin 331 (PD4), and its link-to-TP field contains a pointer to the TP table 118b.

The next PD table 119e in FIG. 15B represents a component pin 312 (PD5), and its link-to-TP field contains a pointer to the TP table 118c. The rightmost PD table 119f in FIG. 15B represents a component pin 332 (PD6), and its link-to-TP field contains a pointer to the TP table 118c.

FIG. 16 is a flowchart illustrating an example of a design verification process. Each operation in FIG. 16 is described below in the order of step numbers.

(S11) The tracing unit 140 receives a user input that specifies a reference circuit and a subject circuit for comparison. The tracing unit 140 further receives another user input that specifies a core component in each of the reference and subject circuits. For example, the tracing unit 140 outputs a GUI window to prompt the user to select core components on the display 11. The user chooses core components by using input devices 12 in this GUI window.

(S12) Based on a trace rule table 115 stored in the storage unit 110, the tracing unit 140 traces the reference circuit and subject circuit. As a result of the tracing, the tracing unit 140 produces trace data of the reference circuit, as well as that of the subject circuit, and outputs the produced data to the difference detecting unit 150.

(S13) Based on the trace data of the reference circuit and subject circuit, the difference detecting unit 150 matches the elements in one set of trace data with their counterparts in the other set of trace data. This element matching actually places a link from one element to its related element for use in a subsequent process of difference detection. The difference detecting unit 150 performs this element matching with the two sets of trace data by crawling through their respective structural trees of TM tables, TPM tables, TP tables, and PD tables.

(S14) The difference detecting unit 150 compares the resulting data of the above element matching to check the difference between corresponding elements. For example, the difference detecting unit 150 compares attribute values of two components. It also compares attribute values of two nets. The difference check of this step S14 is performed on every pair of elements associated at step S13.

(S15) The difference detecting unit 150 outputs the result of difference detection at step S14 on the display 11. For example, the difference detecting unit 150 produces a GUI window including a list of components that are added to, removed from, or changed in the reference circuit.

The next section will describe how the tracing process is performed at step S12. While the tracing unit 140 is supposed to trace both the reference circuit and subject circuit, it is possible to use past trace data for the selected core component, instead of repeating the same tracing again. When such past trace data is available, the tracing unit 140 may skip the tracing process of step S12 for either or both of the two circuits. For this reason, the following description will not explicitly name the particular circuit. The person skilled in the art would appreciate that the description will apply to a reference circuit and a subject circuit in similar ways.

Figure 17:
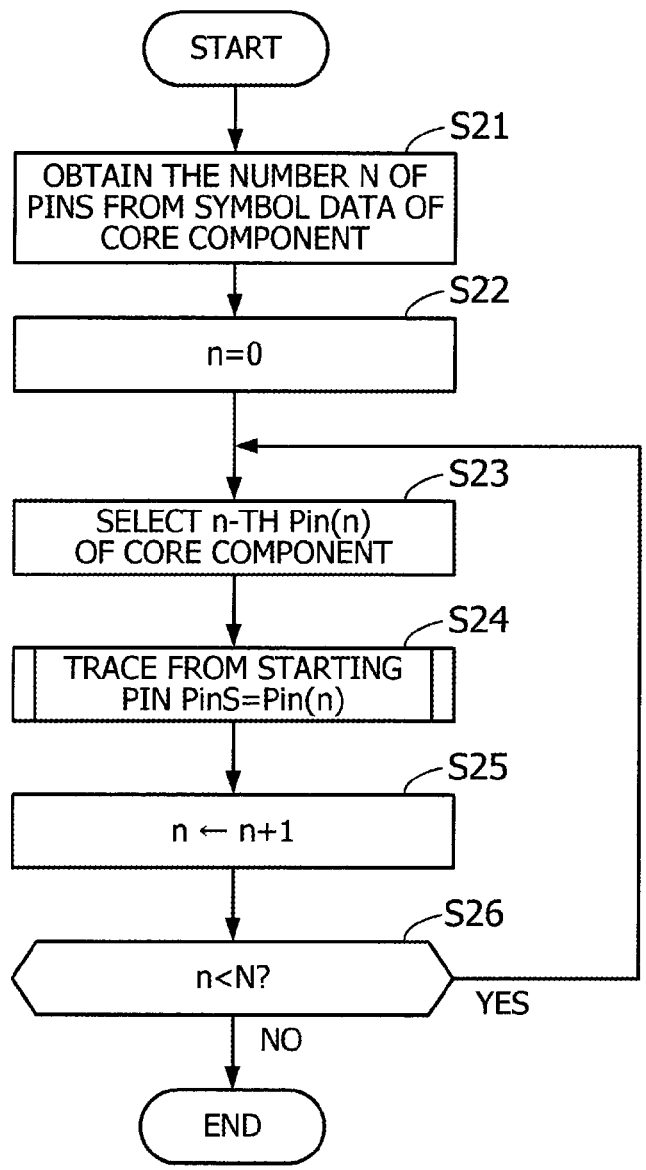
FIG. 17 is a flowchart illustrating an example of a tracing process.

FIG. 17 is a flowchart illustrating an example of a tracing process. Each operation in FIG. 17 is described below in the order of step numbers.

(S21) With reference to component symbol data of the selected core component, the tracing unit 140 obtains the number N of component pins that the core component has, where N is an integer greater than zero. As mentioned previously, component symbol data is stored in the component database. The tracing unit 140 retrieves relevant component symbol data by using a library access key of the core component. The retrieved component symbol data includes information about the layout and the number of pins of the core component. The pins are serial-numbered from zero to N−1 to uniquely identify them within the component. These numbers may be referred to as "component pin numbers." At this step S21, the tracing unit 140 produces a TM table for the core component.

(S22) The tracing unit 140 assigns zero to variable n.

(S23) The tracing unit 140 obtains the n-th pin Pin(n) of the core component. For example, when n=0, the tracing unit 140 obtains a pin that is identified by the component pin number "0."

(S24) The tracing unit 140 starts tracing the circuit in question from Pin(n) as the starting pin PinS. As a result of this tracing, the tracing unit 140 obtains trace data relating to one TPM table, which includes the TPM table itself and its subordinates (TP tables and PD tables).

(S25) The tracing unit 140 substitutes n+1 for variable n (i.e., increments n by one).

(S26) The tracing unit 140 determines whether n<N. When n<N, the process advances to step S23. When n=N, the tracing unit 140 exits from the current process.

Figure 18:
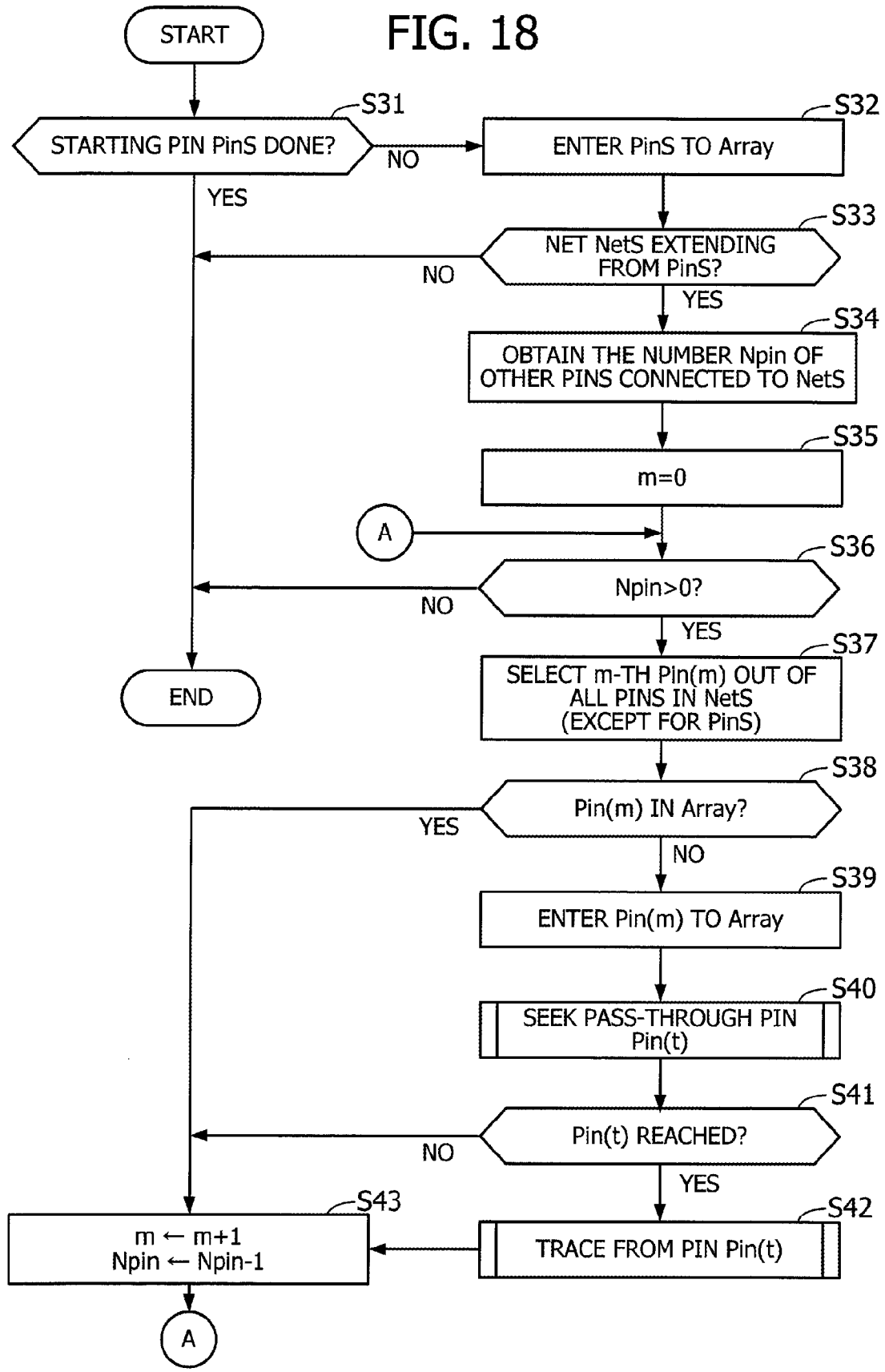
FIG. 18 is an additional flowchart illustrating the example of a tracing process.

The above step S24 will now be described in detail below. FIG. 18 is an additional flowchart illustrating the example of a tracing process of step S24. Each operation in FIG. 18 is described below in the order of step numbers.

(S31) The tracing unit 140 determines whether the processing has been finished for the current starting pin PinS. When the processing has been finished, the tracing unit 140 exits from the current process. When the processing has not been finished, the tracing unit 140 advances to step S32. The tracing unit 140 has an array to manage the component pins that have been processed. The determination of step S31 may be made by consulting this array. Specifically, if the array contains the component pin ID of the current starting pin PinS, then it means that the processing has been finished for PinS. If the array does not contain the component pin ID, it means that the processing for PinS has not been finished.

(S32) The tracing unit 140 enters the component pin ID of PinS to the above-noted array.

(S33) The tracing unit 140 determines whether there is any net NetS extending from the starting pin PinS. When such NetS is present, the process advances to step S34. When no NetS is found, the tracing unit 140 exits from the current process. For example, the determination of step S33 may be made by consulting a component pin table whose component pin ID field matches with the starting pin PinS. When this component pin table contains some values in its link-to-net field, it indicates the presence of a net NetS. When no values are found in the link-to-net field, it means that there are no such nets.

(S34) Variable Npin is an integer greater than zero which represents the number of pending component pins other than the starting pin PinS. The tracing unit 140 obtains an initial value for this variable Npin. Specifically the initial value for Npin may be determined by counting the number of pointers contained in the link-to-pin field of the net table for NetS connected to PinS. Npin is then assigned the number of pointers minus one. In addition to the above, the tracing unit 140 produces a TPM table for the starting pin PinS when PinS belongs to the core component. This initial version of the TPM table, however, contains no values in its link-to-TP field.

The tracing unit 140 also updates the link-to-TPM field of the TM table by adding a pointer pointing to the produced TPM table.

(S35) The tracing unit 140 assigns zero to variable m.

(S36) The tracing unit 140 determines whether Npin is greater than zero. When Npin>0, the process advances to step S37. When Npin=0, the tracing unit 140 exits from the current process.

(S37) The tracing unit 140 selects the m-th component pin Pin(m) of all component pins (but the starting pin PinS) connected to the net NetS.

(S38) The tracing unit 140 determines whether the above-noted array contains the component pin ID of Pin(m). When the component pin ID is present in the array, the process branches to step S43. When the component pin ID is not present, the process advances to step S39.

(S39) The tracing unit 140 enters the component pin ID of Pin(m) to the array.

(S40) The tracing unit 140 tries to reach a pass-through pin Pin(t) by passing through a component according to the trace rule table 115 stored in the storage unit 110. Pin(t) is another pin of the component to which the component pin Pin(m) belongs, and the trace rules may allow the tracing unit 140 to extend the trace to pin Pin(t). As mentioned previously, the present description refers to such Pin(t) as a pass-through pin of the component.

(S41) The tracing unit 140 determines whether a pass-through pin Pin(t) has been found at step S40. When Pin(t) has been found, the process advances to step S42. Otherwise, the process proceeds to step S43.

(S42) The tracing unit 140 executes further tracing from Pin(t) as a new starting pin PinS. That is, the tracing unit 140 executes the above steps step S31 to S43 with Pin(t) being the starting pin PinS. In the case where step S40 has discovered a plurality of pass-through pins Pin(t), the tracing unit 140 executes tracing by selecting those Pin(t) one by one.

(S43) The tracing unit 140 assigns m+1 to variable m and Npin−1 to variable Npin. The process then goes back to step S36.

The tracing unit 140 produces or updates TPM tables, TP tables, and PD tables according to what is found in the course of tracing at steps S31 to S43. For example, the tracing unit 140 repeats steps S36 to S43 to produce new TP tables and PD tables under the current TPM table. Each time a new TP table is produced, the tracing unit 140 populates the link-to-TP field of the TPM table with a pointer to that new TP table. The tracing unit 140 may also update the link-to-adjacent-TP field of existing TP tables.

Figure 19:
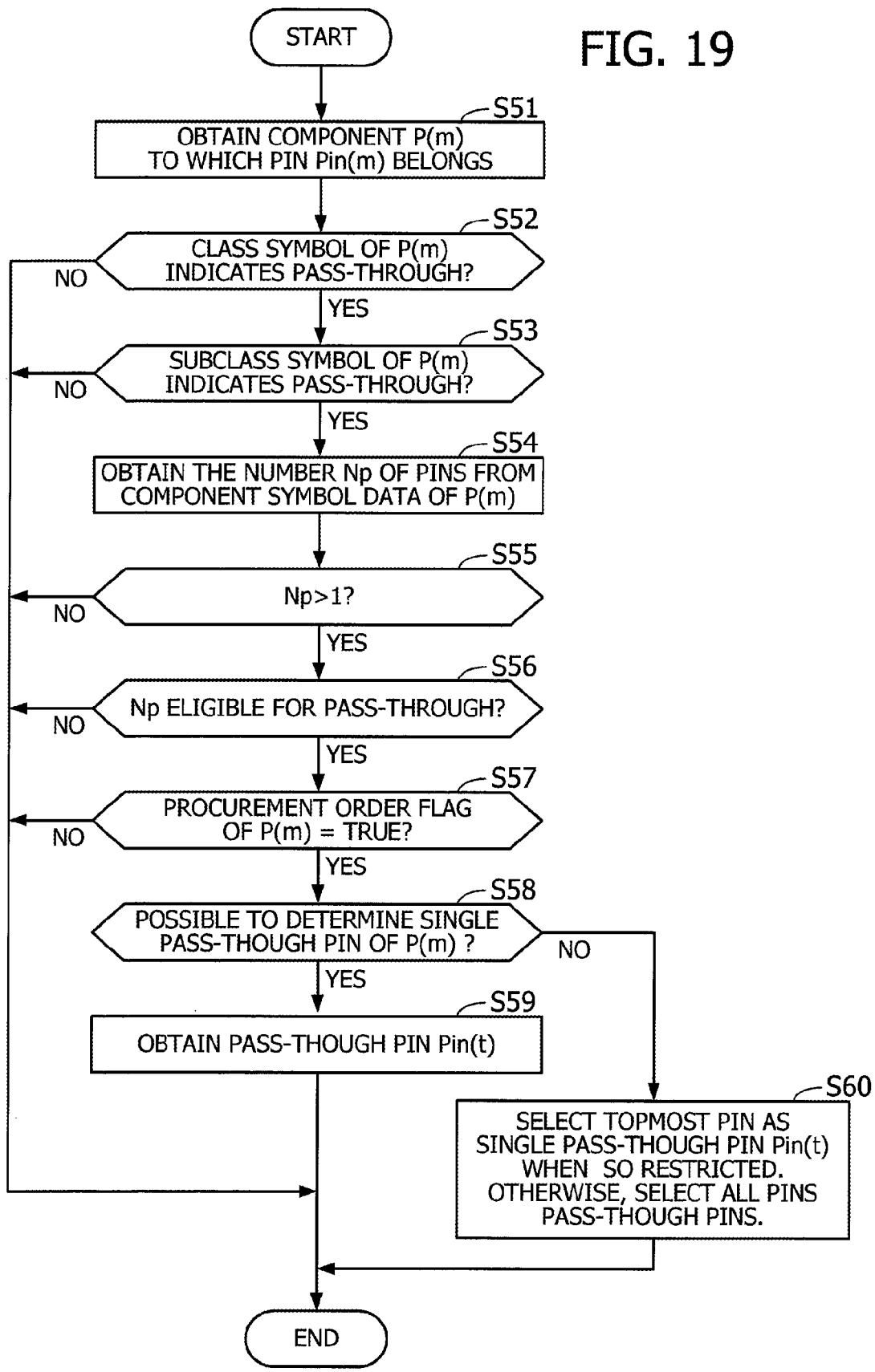
FIG. 19 is a flowchart illustrating an example of a component pin selection process.

The above step S40 will now be described in detail below, assuming that the tracing unit 140 uses the foregoing trace rule table 115 in the storage unit 110. FIG. 19 is a flowchart illustrating an example of a component pin selection process. Each operation in FIG. 19 is described below in the order of step numbers.

(S51) A component pin Pin(m) has been selected previously at step S37 of FIG. 18. The tracing unit 140 now consults a component pin table relevant to the selected component pin Pin(m), thus obtaining a component P(m) to which Pin(m) belongs.

(S52) With reference to the component table for the component P(m), the tracing unit 140 checks the component class symbol of P(m). When the component class symbol indicates that P(m) permits pass-through tracing, the process advances to step S53. Otherwise, the tracing unit 140 exits from the current process. More specifically, this determination is made on the basis of trace rule No. 1 in the trace rule table 115. If the component class symbol of P(m) is included in the set of symbols enumerated in trace rule No. 1, it means that the tracing unit 140 is allowed to pass through the component P(m). If the symbol in question is not included, the tracing unit 140 is not allowed to pass through the component P(m).

(S53) With reference to the component table of the component P(m), the tracing unit 140 checks the component subclass symbol of P(m). When the component subclass symbol indicates that P(m) permits pass-through tracing, the process advances to step S54. Otherwise, the tracing unit 140 exits from the current process. More specifically, this determination is made on the basis of trace rule No. 2 in the trace rule table 115. If the component subclass symbol of P(m) is included in the set of symbols enumerated in trace rule No. 2, it means that the tracing unit 140 is allowed to pass through the component P(m). If the symbol in question is not included, the tracing unit 140 is not allowed to pass through the component P(m).

(S54) With reference to component symbol data of the component P(m), the tracing unit 140 obtains the number Np of component pins, where Np is an integer greater than zero.

(S55) The tracing unit 140 determines whether Np is greater than one. When Np>1, the process advances to step S56. When Np=1, the tracing unit 140 exits from the current process.

(S56) The tracing unit 140 determines whether the component P(m) having Np pins are eligible for pass-through tracing. When P(m) is eligible, the process advances to step S57. When P(m) is not eligible, the tracing unit 140 exits from the current process. More specifically, this determination is made on the basis of trace rule No. 3 in the trace rule table 115. If Np is smaller than or equal to the threshold Nmax defined in the trace rule, it means that the tracing unit 140 can pass through the component. If Np exceeds Nmax, the component does not permit the tracing unit 140 to do that.

(S57) With reference to the component table for the component P(m), the tracing unit 140 checks its component procurement flag. When the flag is set to "true," the process advances to step S58. When the flag is set to "false," the tracing unit 140 exits from the current process. This determination is made on the basis of trace rule No. 4 in the trace rule table 115.

(S58) The tracing unit 140 checks whether it is possible to readily determine a single pin for pass-through tracing of component P(m). When that is possible, the process advances to step S59. When that is not possible, the process branches to step S60 for further investigation. The component P(m) in question may have two or more pins, including the component pin Pin(m) that is currently selected. If the component P(m) has only one pin other than Pin(m), the tracing unit 140 can readily choose that pin for pass-through tracing. If there are two or more remaining pins, the tracing unit 140 is unable to immediately determine which one to choose.

(S59) The tracing unit 140 obtains the component pin singled out as being eligible for pass-through tracing. The tracing unit 140 then exits from the current process, with the obtained path-through pin Pin(t).

(S60) With reference to trace rule No. 5 in the trace rule table 115, the tracing unit 140 determines whether the rule allows multiple pass-through pins. When multiple pass-through pins are allowed, the tracing unit 140 selects all eligible pins for pass-through tracing. When multiple pass-through pins are not allowed (i.e., only one is allowed), the tracing unit 140 selects one eligible component pin with the smallest component pin number as the pass-through pin Pin (t), where the component pin numbers are registered in component symbol data as described previously. The tracing unit 140 then exits from the current process.

Figure 20:
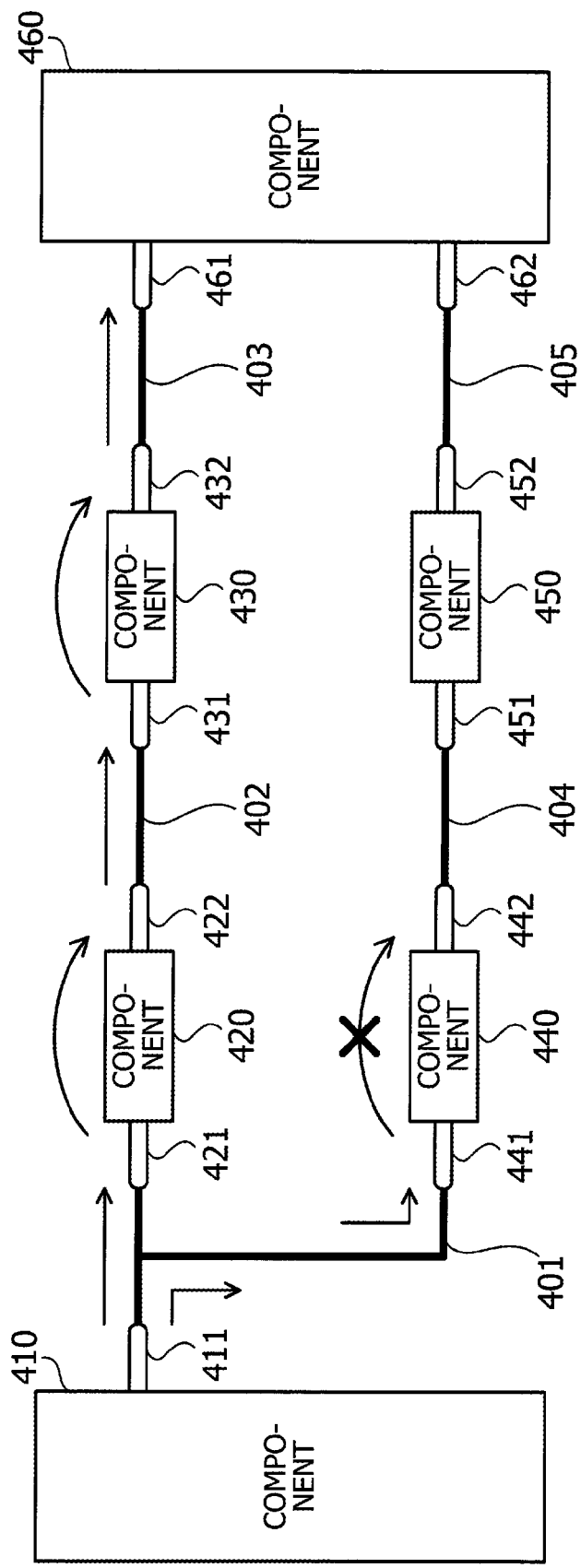
FIG. 20 illustrates an example of tracing.

FIG. 20 illustrates an example of tracing. The illustrated circuit diagram 400 includes a plurality of nets 401, 402, 403, 404, and 405, components 410, 420, 430, 440, 450, and 460, and component pins 411, 421, 422, 431, 432, 441, 442, 451, 452, 461, and 462.

The leftmost component 410 in FIG. 20 has a pin 411. This component 410 is a core component. Another component 420 has two pins 421 and 422. Yet another component 430 also has two pins 431 and 432. These two components 420 and 430 permit pass-through tracing. Still another component 440 has two pins 441 and 442. Still another component 450 also has two pins 451 and 452. The rightmost component 460 in FIG. 20 has two pins 461 and 462. The last three components 440, 450, and 460 do not allow pass-through tracing.

The component pins 411, 421 and 441 belong to one net 401. The component pins 422 and 431 belong to another net 402. The component pins 432 and 461 belong to yet another net 403. The component pins 442 and 451 belong to still another net 404. The component pins 452 and 462 belong to still another net 405.

For example, the tracing unit 140 traces the above circuit diagram 400 as follows. The tracing unit 140 first sets its start point at the component pin 411 and begins tracing its associated net 401. The tracing unit 140 then encounters two component pins 421 and 441, where the former component pin 421 belongs to a component 420. Since this component 420 permits pass-through tracing and actually has a pass-through pin 422 opposite to the pin 421, the tracing unit 140 selects the pin 422 as the next starting pin and begins tracing its associated net 402. The tracing unit 140 then encounters another component pin 431. The component pin 431 belongs to a component 430. This component 430 permits pass-through tracing and actually has a pass-through pin 432 opposite to the pin 431. Accordingly the tracing unit 140 selects the pin 432 as the next starting pin and begins tracing its associated net 403. The tracing unit 140 now encounters yet another component pin 461, which belongs to a component 460. Since the component 460 does not permit pass-through tracing, the tracing unit 140 stops the current tracing at the component 460, regardless of whether the component 460 has other pins. That is, the component 460 makes an endpoint of the trace.

Referring back to the net 401 traced earlier, the component pin 441 belongs to a component 440. Since this component 440 does not permit pass-through tracing, the tracing unit 140 stops the current tracing at the component 440, regardless of whether the component 440 has other pins. That is, the component 440 makes another endpoint of the trace.

The above-described example results in a set of trace data described below. That is, the trace data begins with a TM table representing the core component 410, under which one TPM table is placed for the component pin 411. Linked to this TPM table are three TP tables that describe three nets 401, 402 and 403. The TP table of one net 401 is lined to three PD tables representing component pins 411, 421 and 441. The TP table of another net 402 is linked to that of the net 401, and vice versa, since they are adjacent TPs. Also linked to the TP table of the net 402 are two subordinate PD tables representing component pins 422 and 431. Since the net 402 is adjacent to two nets 401 and 403, TP tables of these three nets are linked together as adjacent TPs. Further, two PD tables representing component pins 432 and 461 are placed under the TP table of the net 403. The TP table of the net 402 is linked to that of the net 403 as its adjacent TP.

The following section will describe a procedure of element matching at step S13 of FIG. 16. Suppose now that two sets of trace data have been obtained by tracing a reference circuit and a subject circuit. The difference detecting unit 150 then executes element matching with the obtained trace data. Specifically the difference detecting unit 150 performs this by determining whether each element (or table) in the trace data of the reference circuit (referred to as the reference trace data) has its counterpart in the trace data of the subject circuit (referred to as the subject trace data).

Figure 21:
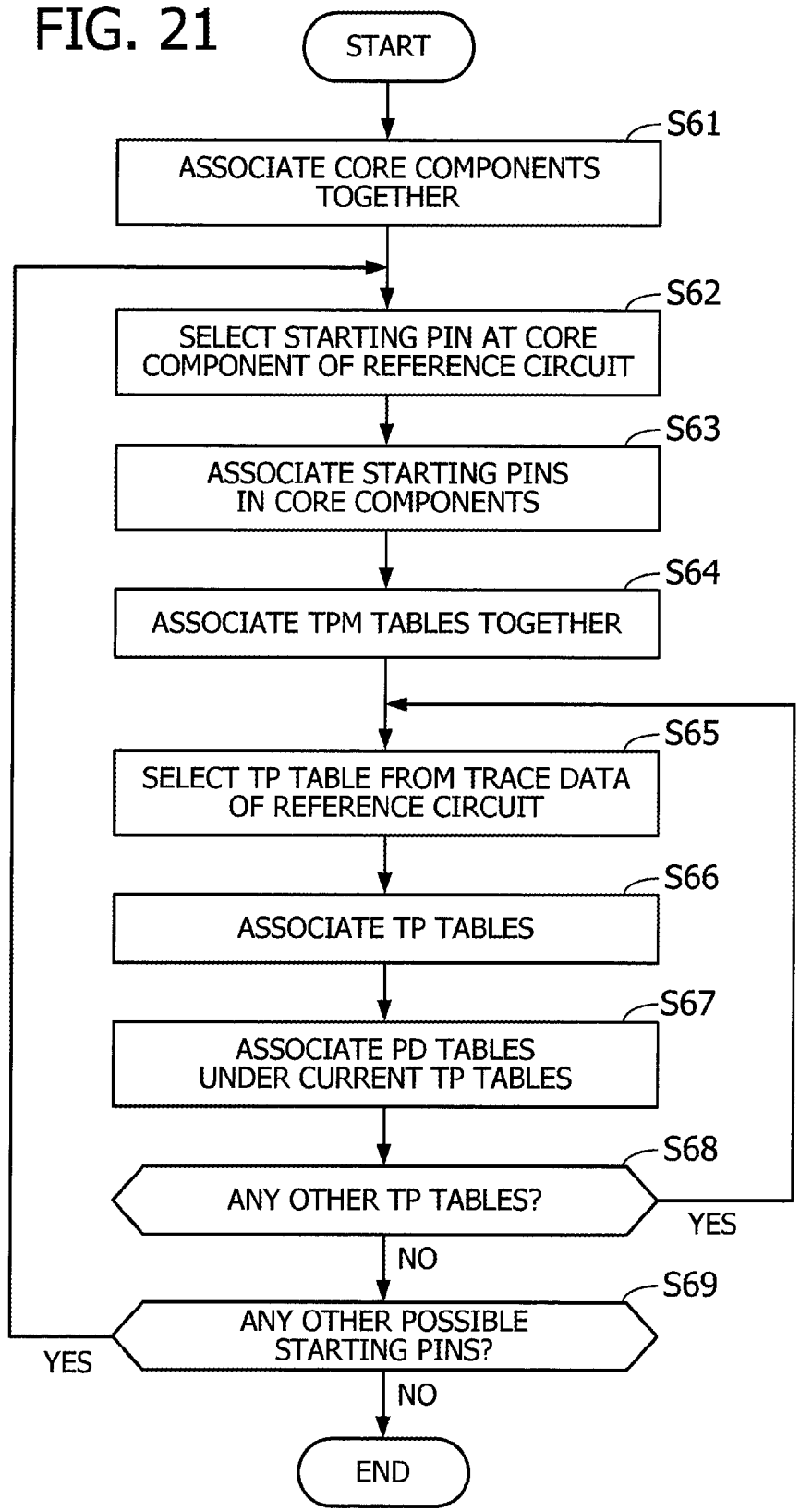
FIG. 21 is a flowchart illustrating an example of an element matching process.

FIG. 21 is a flowchart illustrating an example of an element matching process. Each operation in FIG. 21 is described below in the order of step numbers.

(S61) The difference detecting unit 150 associates two core components together. Since each set of trace data contains only one TM table, this step S61 is achieved by simply associating one TM table with the other.

(S62) The difference detecting unit 150 selects one of the core component pins in the reference circuit and designates it as the starting pin. Once selected, this component pin will not be subjected again to the selection at step S62. For example, the difference detecting unit 150 consults the component symbol data to select a pending component pin with the smallest component pin number.

(S63) The difference detecting unit 150 associates the selected starting pin of the core component in the reference circuit with its matching starting pin in the subject circuit. Once associated, these starting pins will not be subjected again to the matching operation. The matching of starting pins is achieved by consulting the component symbol data to find those having the same component pin numbers.

(S64) The trace data contains TPM tables corresponding to the starting pins associated at step S63. The difference detecting unit 150 associates these TPM tables together. Since there is one TPM table for each starting pin selected at step S62, the difference detecting unit 150 has only to associate one TPM table with the other.

(S65) The difference detecting unit 150 selects one TP table from the reference trace data. Specifically, the difference detecting unit 150 selects TP tables one by one, from the one corresponding to the closest net to the current starting pin of the core component in the reference circuit. If there is a PD table that has just associated with its counter part, the difference detecting unit 150 selects a TP table (adjacent TP table) to which the component indicated by that PD table belongs. Once selected (and associated), the TP table will not be subjected again to the selection at step S65.

(S66) The difference detecting unit 150 associates the TP table selected at step S65 with a TP table contained in the subject trace data. The subject trace data may have a plurality of candidate TP tables for matching with the former TP table. When this is the case, the difference detecting unit 150 retrieves relevant net tables by using net IDs as the search keys and compares data in the retrieved net tables to find a matching net. More specifically, the currently selected TP table of the reference circuit contains a net ID, and the candidate TP tables of the subject circuit contain their respective net IDs. With these net IDs, the difference detecting unit 150 consults the net tables to compare detailed information about the nets in question. It is noted that the difference detecting unit 150 may fail to find matches in the subject trace data. In that case, the difference detecting unit 150 records the TP table having no counterparts.

(S67) There are multiple PD tables belonging to the two matching TP tables found at step S66. The difference detecting unit 150 then finds each pair of matching PD tables and associates them together. Once associated, these PD tables will not be subjected again to the matching operation at step S67. The subject circuit may have a plurality of candidate PD tables for matching with one TP table of the reference circuit. When this is the case, the difference detecting unit 150 retrieves relevant component tables by using component IDs as the search keys and compares data in the retrieved component tables to find a matching component. More specifically, one PD table of the reference circuit contains a component ID, and a plurality of candidate PD tables of the subject circuit contain their respective component IDs. With these component IDs, the difference detecting unit 150 consults the component tables to compare detailed information about the components in question. It is noted, however, that the difference detecting unit 150 may fail to find matching PD tables in the reference circuit or subject circuit. In that case, the difference detecting unit 150 records such PD tables having no counterparts.

(S68) The difference detecting unit 150 determines whether the reference trace data contains any other TP tables that have not associated with any other TP tables. When such a pending TP table is present, the process goes back to step S65. When all TP tables are done, the process advances to step S69.

(S69) The difference detecting unit 150 determines whether there is any other starting pin in the core component of the reference circuit. When such a pending starting pin is present, the process goes back to step S62. When all starting pins are done, the difference detecting unit 150 exits from the current process.

Referring again to the matching of TP tables at step S66, there may be a plurality of candidate TP tables in the subject trace data. The difference detecting unit 150 has therefore to figure out which one matches with the currently selected TP table of the reference circuit. One method to do this is to narrow down the candidate TP tables by comparing their corresponding net tables. More specifically, the difference detecting unit 150 evaluates the similarity of each candidate to the selected TP table in the following criteria: (1) whether their net names are identical; (2) whether they have the same voltage values (when their net type is power supply net); (3) whether their net types (e.g., signal line, power supply net, ground net) are identical; and (4) whether they have equal numbers of connected components. Note that these criteria (1) to (4) are arranged in descending order of similarity weights. The difference detecting unit 150 chooses a TP table that satisfies a smaller-numbered criterion in preference to those that satisfy a larger-numbered criterion.

Suppose, for example, that a first TP table in the reference trace data may match with either a second TP table or a third TP table in the subject circuit. The difference detecting unit 150 first obtains information about a first net corresponding to the net ID contained in the first TP table by retrieving a relevant net table using that net ID. The difference detecting unit 150 also obtains information about a second net corresponding to the net ID contained in the second TP table by retrieving a relevant net table using that net ID. Similarly the difference detecting unit 150 obtains information about a third net corresponding to the net ID contained in the third TP table by retrieving a relevant net table using that net ID. It is assumed here that the first and second nets have the same net name, while the first and third nets have the same number of connected components. It is also assumed that these three nets exhibit no other similarities. The difference detecting unit 150 then chooses the second TP table as being more likely to be the counterpart of the first TP table because the second TP table matches with the first TP table in a criterion with a higher preference than the third TP table.

As a variation of the above example, think of the case in which the third net also has the same net name as the first net. In this situation, the difference detecting unit 150 is unable to immediately determine which candidate to choose. In this case, the difference detecting unit 150 compares the two candidates in terms of the number of matching criteria. Because, in the present example, the third net matches with the first net in more criteria than the second net, the difference detecting unit 150 chooses the third TP table as a counterpart of the first TP table.

Referring again to the matching of PD tables at step S67, the subject trace data may have a plurality of candidate PD tables for comparison with a PD table in the reference trace data. The difference detecting unit 150 has therefore to figure out which one matches with the particular PD table of the reference circuit. One method for this is to narrow down the candidates by comparing their corresponding component tables. More specifically, the difference detecting unit 150 evaluates the similarity of each candidate to the PD table of interest in terms of the following criteria: (1) whether their library access keys are identical; (2) whether they have the same component class symbol and characteristic value (e.g., resistance); (3) whether their component subclass symbols are identical; (4) whether their component class symbols are identical; and (5) whether their component names are identical. These criteria (1) to (5) are arranged in descending order of similarity weights. The difference detecting unit 150 chooses a PD table that satisfies a smaller-numbered criterion in preference to those that satisfy a larger-numbered criterion.

Suppose, for example, that a first PD table in the reference trace data may match with either a second PD table or a third PD table in the subject trace data. The difference detecting unit 150 first obtains information about a first component corresponding to the component ID contained in the first PD table by retrieving a relevant component table using that component ID. The difference detecting unit 150 also obtains information about a second component corresponding to the component ID contained in the second PD table by retrieving a relevant component table using that component ID. Similarly the difference detecting unit 150 obtains information about a third component corresponding to the component ID contained in the third PD table by retrieving a relevant component table using that component ID. It is assumed here that the first and second components matches with each other in their component class symbols and characteristic values, while the first and third components matches with each other in their component subclass symbols and component class symbols. It is also assumed that these three components exhibit no other similarities. The difference detecting unit 150 then chooses the second PD table as being more likely to be the counterpart of the first PD table because the second PD table matches with the first PD table in a criterion with a higher preference than the third PD table.

As a variation of the above example, think of the case in which the third component also has the same characteristic value as the first component. In this situation, the difference detecting unit 150 is unable to readily determine which candidate to choose. The difference detecting unit 150 thus compares the two candidates in terms of the number of matching criteria. In the present example, the third component matches with the first component in more criteria than the second component. Accordingly the difference detecting unit 150 chooses the third PD table as a counterpart of the first PD table.

The storage unit 110 stores a matching rule table that previously define what items are to be evaluated for the matching, as well as what preference (priority) is given to those items. This matching rule table is used in the above-described matching of nets and components.

Figure 22:
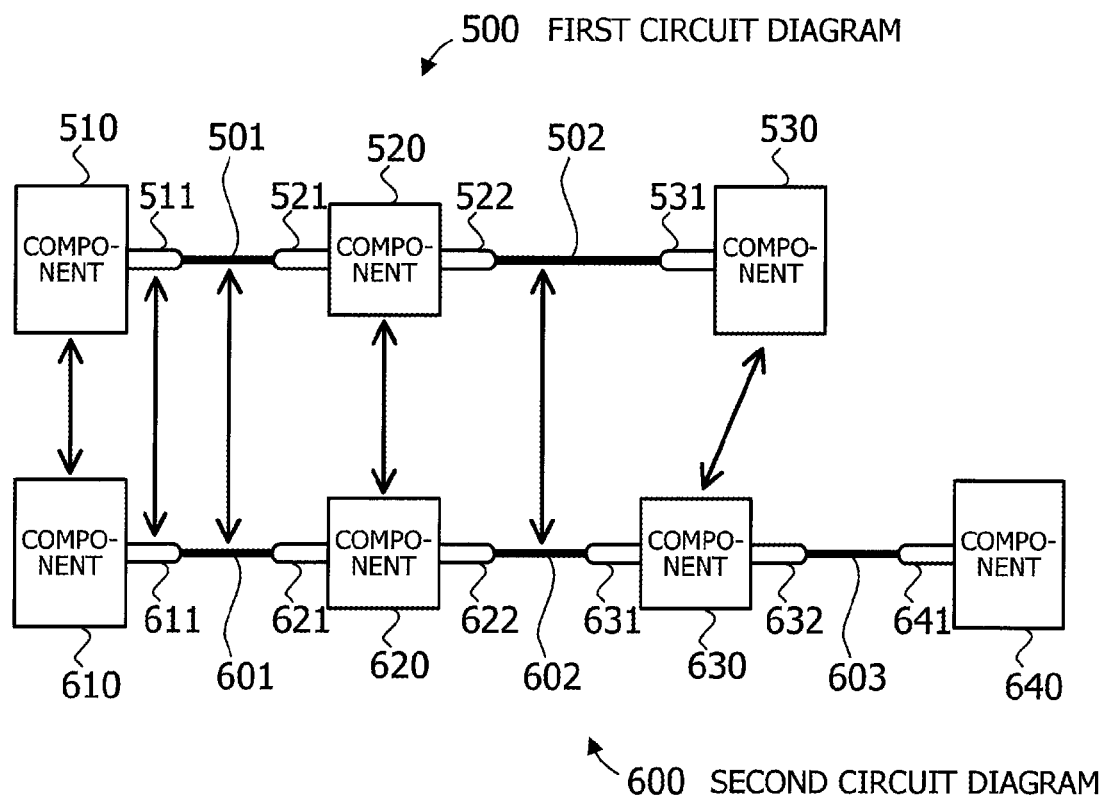
FIG. 22 illustrates an example of element matching.

FIG. 22 illustrates an example of element matching. The element matching procedure of FIG. 21 is used to correlate two circuit diagrams 500 and 600 with each other in this example. The arrows in FIG. 22 indicate which elements in the trace data are associated. The first circuit diagram 500 depicts a part of a reference circuit, which has been extracted by the tracing unit 140. The second circuit diagram 600 depicts a part of a subject circuit to be compared with the reference circuit, which has also been extracted by the tracing unit 140.

The first circuit diagram 500 includes two nets 501 and 502, three components 510, 520, and 530, and four component pins 511, 521, 522 and 531. The leftmost component 510 in FIG. 22 has a pin 511. The middle component 520 has two pins 521 and 522. The rightmost component 530 has a pin 531. The former two component pins 511 and 521 belong to a net 501. The latter two component pins 522 and 531 belong to another net 502.

The second circuit diagram 600 includes three nets 601, 602 and 603, four components 610, 620, 630, and 640, and six component pins 611, 621, 622, 631, 632, and 641. The leftmost component 610 in FIG. 22 has a pin 611. The next component 620 has two pins 621 and 622. The next component 630 has two pins 631 and 632. The rightmost component 640 has a pin 641. The first two component pins 611 and 621 belong to a net 601. The second two component pins 622 and 631 belong to a net 602. The third two component pins 632 and 641 belong to a net 603.

Core components 510 and 610 have been specified in the first and second circuit diagrams 500 and 600, respectively. All the elements seen in FIG. 22 have been extracted as a result of the tracing from these core components 510 and 610. The difference detecting unit 150 first associates TM tables together to indicate the matching of the core components 510 and 610. The difference detecting unit 150 associates TPM tables of two component pins 511 and 611 together to indicate the matching of the only pin of each core component 510 and 610. When the core components 510 and 610 have two or more pins, the component 510 sorts their TPM tables into pairs, based on the component pin numbers described in the component symbol data.

Subsequently the difference detecting unit 150 associates two TP tables of nets 501 and 601 together, where the nets 501 and 601 respectively belong to the above-noted two TPM tables. The difference detecting unit 150 associates two PD tables of components 520 and 620 together, where the components 520 and 620 respectively belong to the above two TP tables.

The difference detecting unit 150 further associates two TP tables of nets 502 and 602 together, where the nets 502 and 602 respectively belong to two TPM tables of component pins 511 and 611. The difference detecting unit 150 associates PD tables of two components 530 and 630 together, where the components 530 and 630 respectively belong to the above TP tables. Since all elements in the trace data of the first circuit diagram 500 have been exhausted, the difference detecting unit 150 terminates the element matching process.

The elements (tables) in the trace data have undergone the matching process. Based on the resulting data, the difference detecting unit 150 now seeks the difference of nets and components between the two sets of circuit data. Referring to, for example, the first and second circuit diagrams 500 and 600, the difference detecting unit 150 investigates a pair of nets 501 and 601 by comparing attributes and other values registered in their respective net tables, thus detecting their differences. The difference detecting unit 150 does the same with another pair of nets 502 and 602. For the remaining net 603, however, the first circuit diagram 500 has no counterparts. Accordingly the difference detecting unit 150 concludes that the net 603 is an element that was added at the time of importing the first circuit diagram 500.

For example, the difference of nets detected in the above processing may include the following items: (1) net name, (2) voltage, (3) the number of connected components, and (4) solitary net (i.e., net with no counterpart). This list is only an example, and the actual implementation may add more items for difference detection.

The difference detecting unit 150 also investigates a pair of components 510 and 610 by comparing attributes and other registered values, thus detecting their differences. The same applies to another pair of components 520 and 620, and also to yet another pair of components 530 and 630. Since the first circuit diagram 500 has no counterparts for the last component 640, the difference detecting unit 150 concludes that the component 640 is an element that was added at the time of importing the first circuit diagram 500.

The difference of components may include the following items: (1) library access key; (2) component name; (3) component characteristics (e.g., electrical resistance in the case of resisters, capacitance in the case of capacitors, inductance in the case of electromagnetic coils); (4) component class symbol; (5) component subclass symbol; and (6) solitary component. This list is only an example, and the actual implementation may add more items for difference detection.

Without the proposed method and apparatus, the user would visually identify and extract a portion of the subject circuit into which a part of the reference circuit has been imported. The user would then look into details of the extracted portion to find modifications made to circuit connections and component parameters. However, this visual detection has at least the following drawbacks: (1) As the complexity of circuit connections increases, the user finds it more difficult to locate an imported portion of the circuit, which could lead to failure in extracting the correct portion. (2) It is not always easy to locate a correct pair of circuit elements (e.g., components and nets) for difference detection. The user may compare an element with its wrong counterpart. (3) It is likely to overlook some differences between elements.

Another approach is to compare the entire reference circuit with the entire subject circuit and detect their differences. This approach, however, still has the following drawbacks: (4) The result of a full circuit comparison include extraneous differences that the user does not need to check. (5) The detection is limited in scope (e.g., presence of components) and unable to take into consideration of the flow of signals along the nets or the order of connected components. (6) The difference detection is too sensitive to the names of components and signals. (7) It is time-consuming to find desired information buried in a large amount of difference data. These drawbacks could result in a delay of circuit design, poor quality of products, and extra man-power consumption for rework.

In view of the above, the design aiding apparatus 100 is configured to trace a reference circuit and a subject circuit by crawling through their circuit data from a core component specified in each circuit. The resulting trace data is then subjected to a difference detection process. This feature of the design aiding apparatus 100 avoids comparison of extraneous portions in the reference circuit and subject circuit. It is noted that a comparison is made on the limited portions obtained by tracing wiring lines from the core components in the circuits. This means that the extracted circuit portions have direct or indirect relationships with the core components. In other words, the comparison skips other circuit portions unrelated to the core components.

The present embodiment works effectively in the case where the comparison is expected to cover not the entire reference circuit, but only a particular part of the reference circuit. That is, the reference circuit may include some portion that is not of current interest. It is not efficient to execute element matching for such portions of the circuit.

The present embodiment allows the user to select core components in the reference circuit and subject circuit, so that the scope of comparison will be determined automatically based on the selected core components. The present embodiment makes it possible to execute an element matching process more efficiently, focusing on the desired portion. The user may also modify the trace rules to expand or shrink the comparison range in the reference circuit and subject circuit.

According to the present embodiment, the trace data is designed to contain extracted elements in a special structure suitable for the purpose of element matching, so that a reference circuit is compared with a subject circuit with consideration of the order that the elements are connected. The elements are compared in details in terms of attributes including their characteristic values.

The present embodiment avoids unnecessary element matching or difference detection and executes a detailed comparison of attributes on a set of elements of interest. This feature makes it less likely to detect an overly large number of differences and thus helps the user review the desired portion of circuits. The proposed method of element matching and difference detection is faster and more efficient because extraneous comparison is eliminated.

The above description has exemplified an algorithm that begins element matching with core components. The user may, however, be aware of which components were added to or removed from the original circuit. In such a case, the user may wish to intervene in the element matching process for the purpose of more accurate and flexible matching. The proposed matching algorithm may therefore be modified to permit the user to specify some components for some exceptional treatment. For example, such components may be excluded from the matching, or may be previously bound together as matching elements. The following section will describe how the proposed method handles user-specified exceptional elements.

Figure 23:
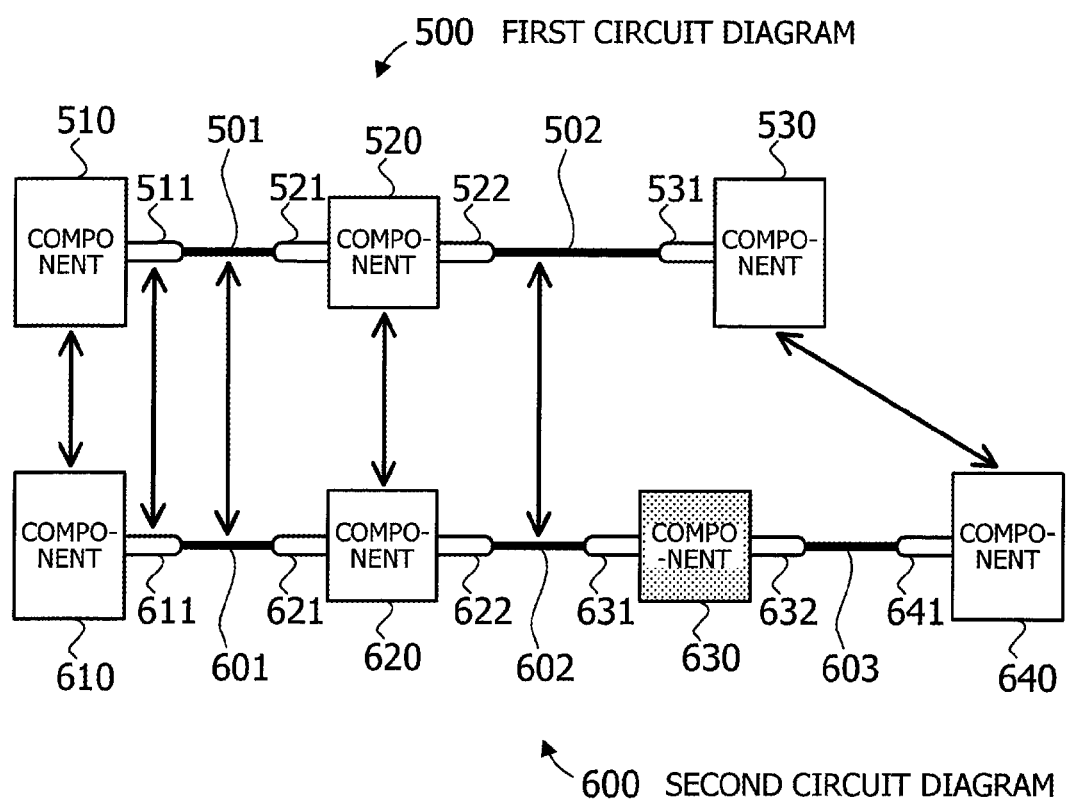
FIG. 23 illustrates another example of element matching.

FIG. 23 illustrates a first example of element matching. This particular example illustrates a case in which an exclusion component is specified in the circuit. Exclusion components are a kind of exceptional components that will not be subjected to element matching or difference detection. In the illustrated second circuit diagram 600, the user has specified a component 630 as an exclusion component. Core components 510 and 610 have been specified in the first and second circuit diagrams 500 and 600, respectively. All the elements seen in FIG. 23 have been extracted as a result of the tracing from specified core components 510 and 610. The proposed design aiding apparatus 100 executes an element matching process on such trace data of the first and second circuit diagrams 500 and 600.

The difference detecting unit 150 operates similarly to the foregoing case of FIG. 22, up to the point of associating TP tables of two matching nets 502 and 602. Unlike the processing described in FIG. 22, the difference detecting unit 150 does not associate PD tables of the next two components 530 and 630 because the latter component 630 is specified as an exclusion component. Instead, the difference detecting unit 150 skips the exclusion component 630 and associates the PD table of the component 530 with that of another component 640 in the second circuit diagram 600. This component 640 belongs to a solitary net 603 adjacent to the net 602. When there are a plurality of nets adjacent to the net 602, their associated PD tables are candidate PD tables that may match with the component 530. When this is the case, the difference detecting unit 150 retrieves relevant component tables by using component IDs in each PD table and qualifies the candidates based on detailed information in the retrieved component tables, as described previously.

For example, the user may specify the component 630 as an exclusion component when he or she knows that the component 630 was not present in the original circuit. The design aiding apparatus 100 may be configured to allow such user intervention in its element matching operation. Without the intervention, the design aiding apparatus 100 would associate two components 530 and 630 together. In contrast, the design aiding apparatus 100 associates a different pair of components 530 and 640 together because of the above intervention, thus obtaining a difference between these components 530 and 640.

Figure 24A:
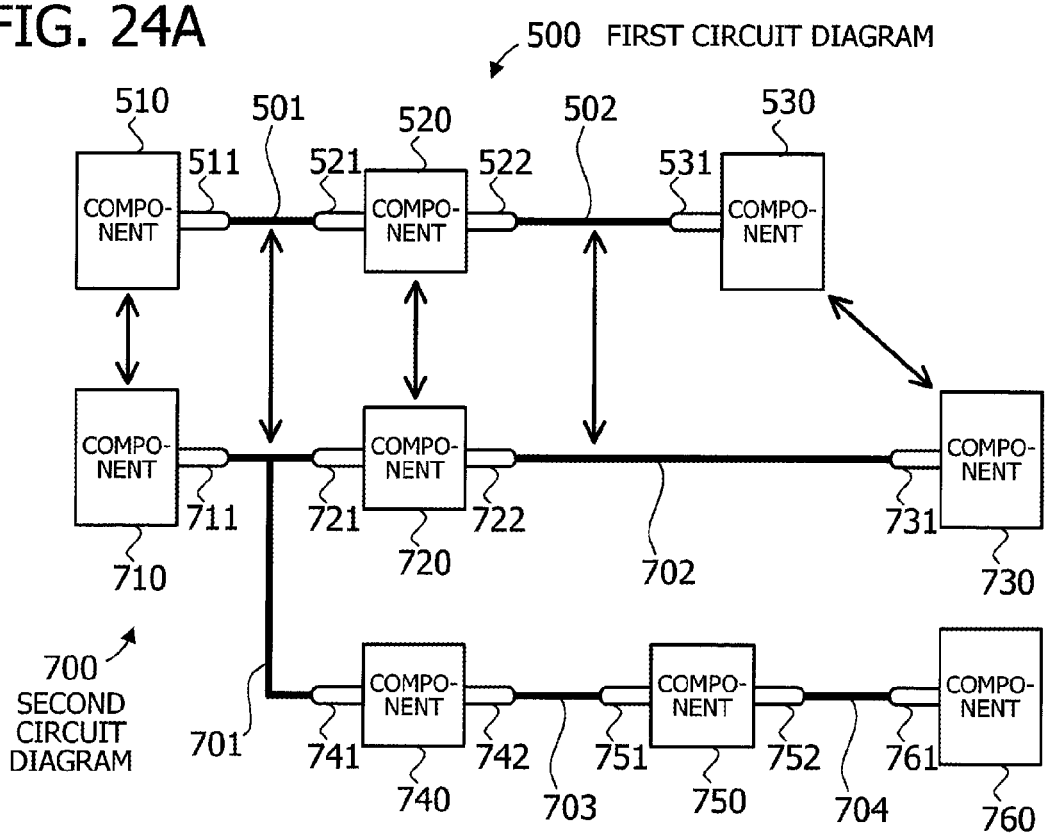
FIGS. 24A and 24B illustrate another example of element matching.
Figure 24B:
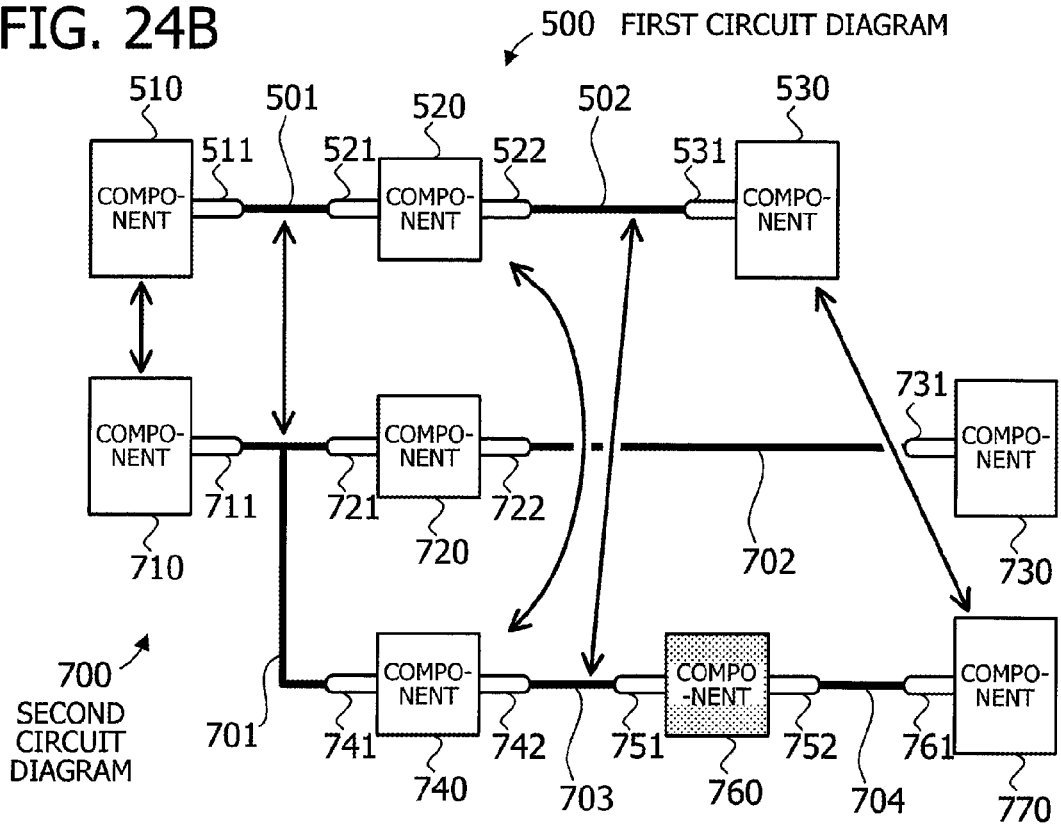

FIGS. 24A and 24B illustrate another example of element matching. Specifically FIG. 24A exemplifies ordinary element matching between a first circuit diagram 500 and a second circuit diagram 700. FIG. 24B, on the other hand, illustrates the case in which a bound component and an exclusion component are specified. The term "bound component" refers to a pair of components that are supposed to be associated together.

The second circuit diagram 700 depicts a part of a subject circuit to be compared with a reference circuit, which has been extracted by the tracing unit 140. Specifically the second circuit diagram 700 includes a plurality of nets 701, 702, 703, and 704, components 710, 720, 730, 740, 750, and 760, and component pins 711, 721, 722, 731, 741, 742, 751, 752, and 761. The component 710 has a pin 711. The component 720 has two pins 721 and 722. The component 730 has a pin 731. The component 740 has two pins 741 and 742. The component 750 has two pins 751 and 752. The component 760 has a pin 761. Three component pins 711, 721 and 741 belong to a net 701. Two component pins 722 and 731 belong to another net 702. Another two component pins 742 and 751 belong to yet another net 703. Yet another two component pins 752 and 761 belong to still another net 704.

Core components 510 and 710 have been specified in the first and second circuit diagrams 500 and 700, respectively. All elements seen in these two circuit diagrams have been extracted as a result of tracing from the core components 510 and 710. Referring to FIG. 24A, the difference detecting unit 150 executes an element matching process in the way described in FIG. 21. During this course, the difference detecting unit 150 associates TM tables indicating the core components 510 and 710, and then TPM tables of their respective component pins 511 and 711.

The difference detecting unit 150 further associates TP tables of two nets 501 and 701, which respectively belong to the above two TPM tables. The difference detecting unit 150 then turns to a component 520 belonging to the TP table of the former net 501. There are two candidate PD tables that may match with the PD table of this component 520, as can be seen from the second circuit diagram 700 of FIG. 24A. One is of a component 720, and the other is of another component 740. In this case, the difference detecting unit 150 chooses one of the two candidates by evaluating their corresponding component tables. That is, each corresponding component table of these two components 720 and 740 is compared with the component table of the component 520 in terms of the number of matching items and the preference of each matching item as described in a previous section. It is assumed in FIG. 24A that the difference detecting unit 150 chooses the PD table of the former component 720 and associates it with that of the component 520.

The difference detecting unit 150 further associates TP tables of another pair of nets 502 and 702, which respectively belong to the TPM tables of component pins 511 and 711. The difference detecting unit 150 then associates PD tables of two components 530 and 730, where the components 530 and 730 respectively belong to the associated TP tables. Now that every element in the trace data of the first circuit diagram 500 has found its counterpart, the difference detecting unit 150 exits from the element matching process.

Referring now to FIG. 24B, a pair of components 520 and 740 are specified as bound components, and a component 760 as an exclusion component. The element matching process handles this case as follows. The difference detecting unit 150 first associates TM tables indicating core components 510 and 710, and then TPM tables of their respective component pins 511 and 711. Subsequently the difference detecting unit 150 associates TP tables of two nets 501 and 701 together, where the nets 501 and 701 respectively belong to the above-noted two TPM tables. The difference detecting unit 150 then turns to a component 520 belonging to the TP table of the former net 501. There are two candidate PD tables that may match with the PD table of this component 520, as can be seen from the second circuit diagram 700 of FIG. 24B. One is of a component 720, and the other is of another component 740. Since the component 520 has been specified as one of the bound components 520 and 740, the difference detecting unit 150 readily associates PD tables of these components 520 and 740, without relying on the above-described evaluation of matching items.

The difference detecting unit 150 further associates TP tables of two nets 502 and 703, which respectively belong to the TPM tables of component pins 511 and 711. Note that it is not the net 702, but the net 703 that the difference detecting unit 150 finds relevant to the net 502. This is because one of the PD tables associated above indicates a pin 742 of the component 740, and because the component pin 742 belongs not to the net 702, but to the net 703.

Subsequently the difference detecting unit 150 associates PD tables of components 530 and 770 together. Note that the difference detecting unit 150 has skipped a component 760. The component 760 is not eligible since it is an exclusion component.

As can be seen from the above, a pair of components 520 and 740 is specified as bound components. This setup forces the difference detecting unit 150 to choose the component 740, rather than component 720, for the component 520 when it determines which PD tables to associate. This feature of bound components makes it possible to incorporate the user's intended order of elements into the matching process and thus improves efficiency of design verification. The next section will now provide several specific examples of GUI windows according to the second embodiment.

Figure 25:
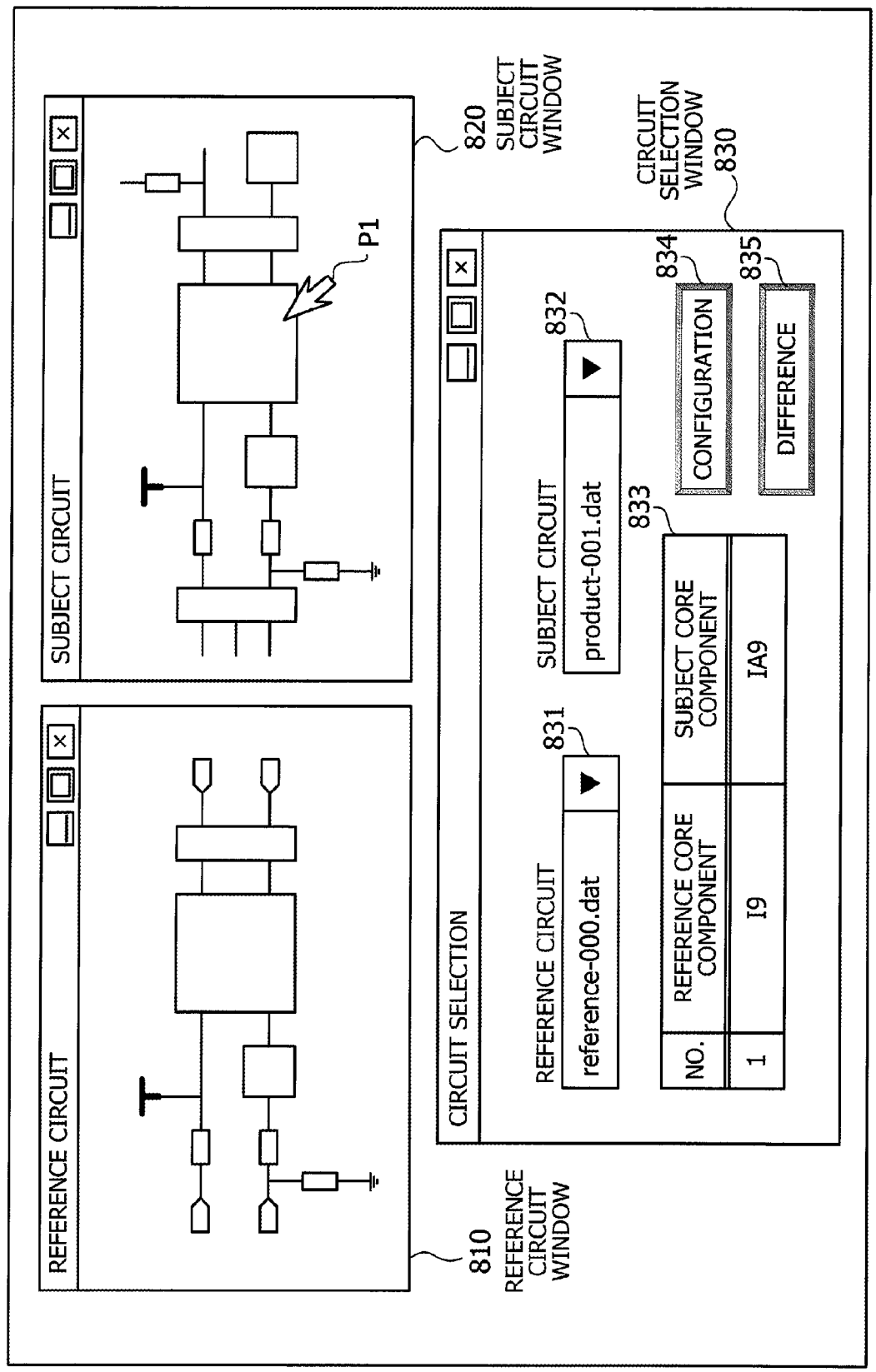
FIG. 25 illustrates a first example of a GUI window.

FIG. 25 illustrates a first example of GUI windows. Here the tracing unit 140 provides the user with the following three windows: reference circuit window 810, subject circuit window 820, and circuit selection window 830. The tracing unit 140 may output these windows on a screen of the display 11.

The reference circuit window 810 is provided to display a circuit diagram of a reference circuit. The subject circuit window 820 is provided to display a circuit diagram of a subject circuit that is to be compared with the reference circuit. The user is allowed to select a component seen in the reference circuit window 810 and subject circuit window 820 by manipulating a cursor P1 with an input device 12. For example, the user may place the cursor P1 over a particular component and press an appropriate button of the input device 12. This action informs the tracing unit 140 of a selection made by the user. The tracing unit 140 thus recognizes the selected component as, for example, a core component.

The circuit selection window 830 is used to select data files of reference and subject circuits and display core components in each circuit diagram. The illustrated circuit selection window 830 includes a reference circuit selection form 831, a subject circuit selection form 832, a core component form 833, a configuration button 834, and a difference check button 835.

The reference circuit selection form 831 is used to select a data file of a reference circuit diagram. The subject circuit selection form 832 is used to select a data file of a subject circuit diagram. For example, the reference circuit selection form 831 and subject circuit selection form 832 are implemented as pull-down list boxes. The user may select circuit diagrams of by manipulating the cursor P1. Based on the data of a selected reference circuit diagram, the tracing unit 140 draws the diagram in the reference circuit window 810. Based on the data of a selected subject circuit diagram, the tracing unit 140 draws the diagram in the subject circuit window 820.

The core component form 833 is used to indicate component IDs of core components that the user has selected in the reference circuit window 810 and subject circuit window 820. In the example of FIG. 25, the core component form 833 contains a component ID "19" to indicate a specified core component of the reference circuit. The core component form 833 also contains a component ID "IA9" to indicate a specified core component of the subject circuit. The configuration button 834 calls up another GUI window that permits the user to specify bound components and exclusion components. The difference check button 835 is used to invoke a series of processing operations (i.e., tracing, element matching, and difference detection) by using specified parameters. For example, the user may use the cursor P1 to select and press the configuration button 834 or difference check button 835.

Figure 26:
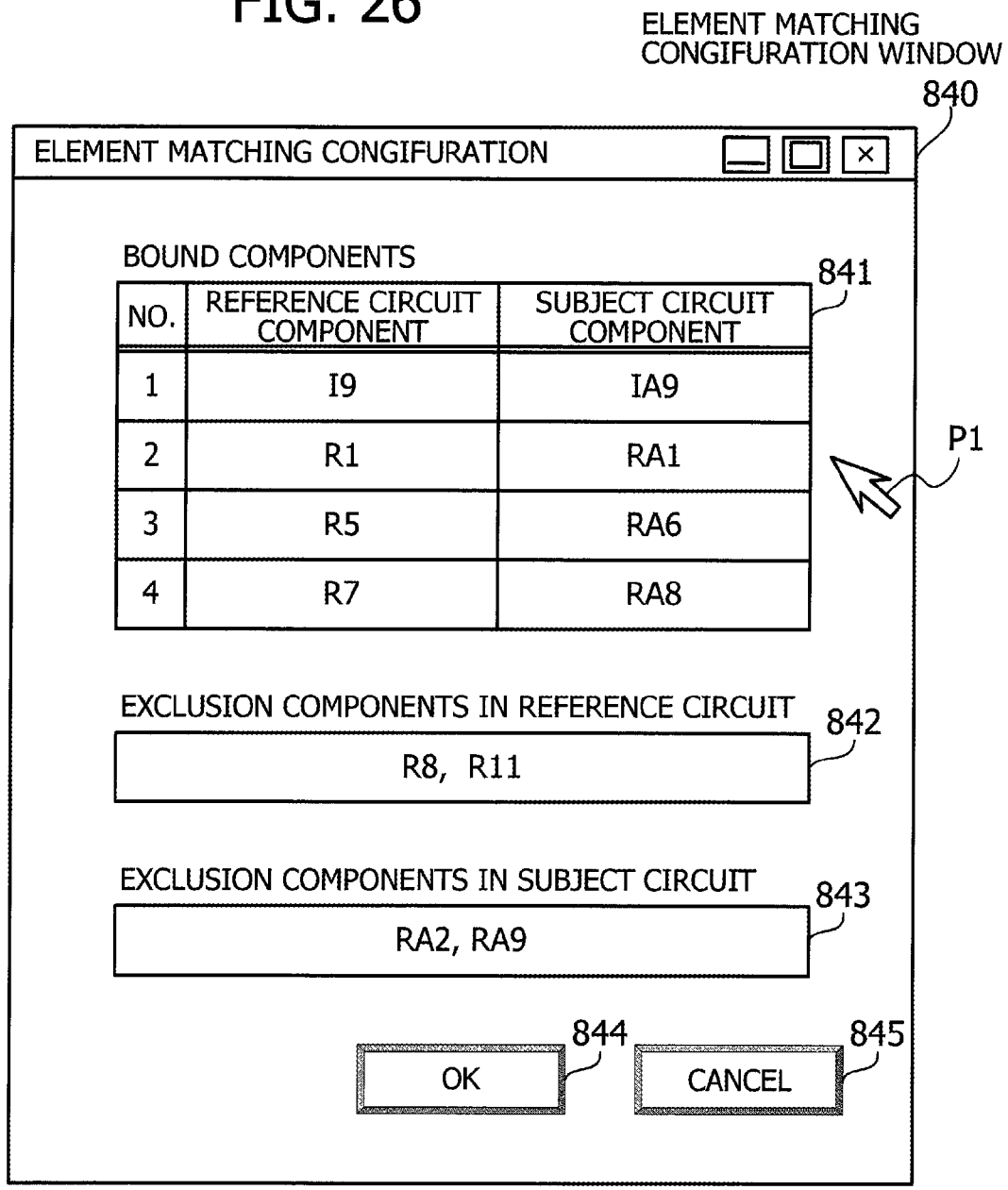
FIG. 26 illustrates a second example of a GUI window.

FIG. 26 illustrates a second example of a GUI window. The tracing unit 140 provides this GUI window to the user. Specifically, an element matching configuration window 840 appears on the display 11 when the configuration button 834 in the circuit selection window 830 is pressed. The illustrated element matching configuration window 840 includes a bound component form 841, exclusion component forms 842 and 843, an OK button 844, and a cancel button 845.

The bound component form 841 is used to specify one or more pairs of components as bound components by selecting one component ID from the reference circuit and another component ID from the subject circuit. Each row of the bound component form 841 represents one pair of bound components, and the number of such rows may vary. The user may place the cursor P1 at one data field of the bound component form 841 and enter a component ID to that field. Row No. 1 indicates two core components with component IDs of "19" and "IA9" as a pair of bound components. Core components may be bound in this way because they are supposed to exist as a sole component in each circuit and thus always have a one-to-one relationship. This pair is registered as a default setup of the bound components. Row No. 2 of the bound component form 841 indicates another pair of bound components with component IDs "R1" and "RA1."

The exclusion component form 842 is used to specify exclusion components in the reference circuit. For example, the illustrated exclusion component form 842 contains two component IDs "R8" and "R11" to indicate exclusion components in the reference circuit.

The exclusion component form 843 is used to specify exclusion components in the subject circuit. For example, the illustrated exclusion component form 843 contains two component IDs "RA2" and "RA9" to indicate exclusion components in the subject circuit.

The OK button 844 is used to close the element matching configuration window 840 after saving the entered parameters in each form. The cancel button 845 also closes the element matching configuration window 840, but discarding all the current content of the forms. For example, the user may use the cursor P1 to select and press the OK button 844 or cancel button 845.

Figure 27:
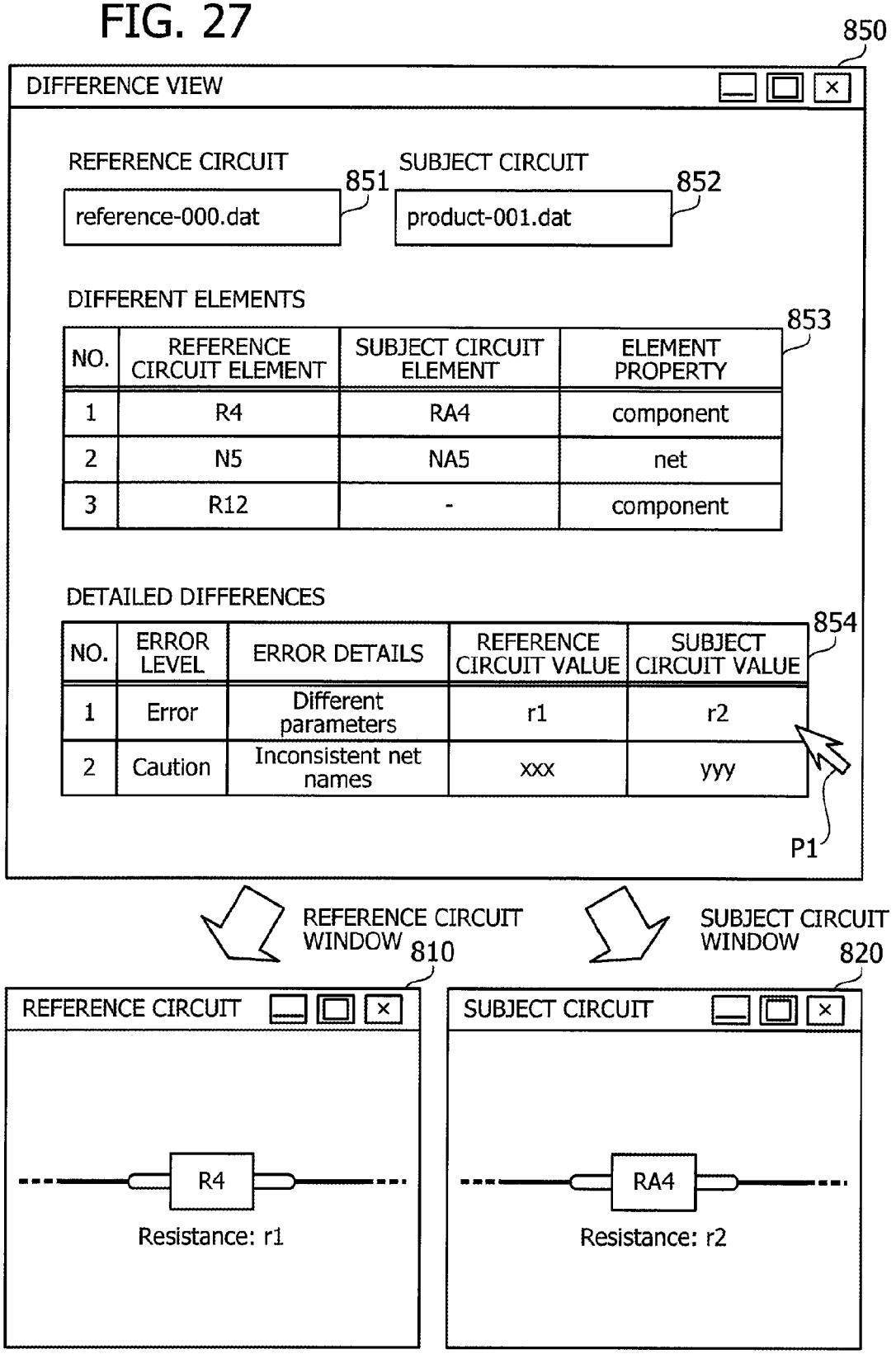
FIG. 27 illustrates a third example of a GUI window.

FIG. 27 illustrates a third example of a GUI window. The difference detecting unit 150 provides this GUI window to the user. Specifically, the difference detecting unit 150 executes a difference checking process upon depression of the difference check button 835 in the circuit selection window 830 (see FIG. 25). The illustrated difference view window 850 appears on the display 11 when that process is finished.

To provide the result of difference checking, the difference view window 850 includes a reference circuit form 851, a subject circuit form 852, a different element form 853, and a detailed difference form 854. The reference circuit form 851 and subject circuit form 852 indicate data names of the reference circuit diagram and subject circuit diagram, respectively. The different element form 853 provides a list of elements that have been detected as the difference between the two circuits. Each row represents a single difference in the elements.

For example, the different element form 853 in FIG. 27 indicates the following information. Row No. indicates that one element "R4" in the reference circuit is found to be different from its counterpart, element "RA4," in the subject circuit. The corresponding element property field indicates that these elements are of the component class. Row No. 2 indicates that another element "N5" in the reference circuit is found to be different from its counterpart, element "NA5," in the subject circuit. The corresponding element property field indicates that these elements are of the net class. The row No. 3 indicates that one component "R12" in the reference circuit has no counterparts in the subject circuit.

The detailed difference form 854 provides detailed information about the detected differences. This detailed difference form 854 is associated with the different element form 853 by their common row numbers (e.g., No. 1 and No. 2). Note that the detailed difference form 854 has no rows corresponding to row No. 3 of the different element form 853. This is due to the absence of counterpart components (i.e., the lack of attributes or other detailed information).

For example, the detailed difference form 854 in FIG. 27 provides the following information. Row No. 1 indicates the detailed difference between component R4 in the reference circuit and component RA4 in the subject circuit. More specifically, the error level field "Error" suggests that the difference is due to an error in design. The error details field indicates the fact that the two components have different characteristic parameters. Since the components in question are resistors, the corresponding reference circuit value field and subject circuit value field indicate the resistance r1 of component R4 and the resistance r2 of component RA4, respectively.

Row No. 2 indicates the detailed difference between net N5 in the reference circuit and net NA5 in the subject circuit. The error level field "Caution" suggests that the difference is not necessarily due to a wrong design choice, but at least worth calling the user's attention. The error details field indicates that the two nets are inconsistent in their names. More specifically, the corresponding reference circuit value field and subject circuit value field indicate that net N5 is named "xxx" whereas its associated net NA5 is named "yyy."

The user may manipulate the cursor P1 to select a row in the different element form 853 or detailed difference form 854. In response, the difference detecting unit 150 provides an enlarged view of each element described in the selected row. For example, the difference detecting unit 150 commands the tracing unit 140 to draw such an enlarged element view in the foregoing reference circuit window 810 and subject circuit window 820.

Suppose, for example, that the user selects row No. 1 in the detailed difference form 854. This act causes the reference circuit window 810 to present an enlarged view of component R4. At the same time, the subject circuit window 820 presents an enlarged view of component RA4. In this way, the design aiding apparatus 100 emphasizes the elements that are found to be different, so that the user recognizes the difference easily. This feature contributes to an increased efficiency of circuit design verification.

As mentioned above, the data processing operations according to the first embodiment are realized by causing the computation unit 1b to execute a program stored in the storage unit 1a. Also, the data processing operations according to the second embodiment are realized by causing the processor 101 to execute a program stored in the RAM 102. Such programs may be encoded in computer-readable storage media (e.g., optical disc 13, memory device 14, memory card 16).

Portable storage media may be used for distribution of programs. Programs may also be stored in a storage device of a computer for distribution to other computers via a network. A computer executes programs read out of its local storage device, which have been previously installed from a portable storage medium or downloaded from a remote computer. Alternatively, the computer may execute programs read out of a portable storage medium or downloaded from the remote computer, without installing them in its local storage device.

It is further noted that all or some of the foregoing data processing operations may be implemented with DSP, ASIC, PLD, or other electronic devices, or any combinations of the same.

Various embodiments have been discussed above. In one aspect of the embodiments, the proposed techniques make it possible to detect differences between two circuits more efficiently.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A non-transitory computer-readable storage medium storing a program which causes a computer to perform a procedure comprising:

locating data of a first component in a reference circuit which is imported into another circuit, as well as data of a second component in a product circuit which is designed by using the reference circuit;

obtaining data of a first portion of the reference circuit by tracing wiring lines from component to component in the reference circuit, with the first component as a start point;

obtaining data of a second portion of the product circuit by tracing wiring lines from component to component in the product circuit, with the second component as a start point; and outputting data indicating differences between the first portion and second portion, based on the obtained data of the first portion and the obtained data of the second portion, wherein the outputting includes:

comparing first attribute values, included in a component table and a net table, of components and wiring lines included in the data of the first portion with second attribute values, included in the component table and the net table, of components and wiring lines included in the data of the second portion; and producing data indicating differences in the components and wiring lines between the first portion and second portion.

2. The non-transitory computer-readable storage medium according to claim 1, wherein the obtaining of data of the first portion, as well as the obtaining of data of the second portion, includes tracing the wiring lines based on information that describes whether to pass through a component in a circuit, depending on attributes of the component.

3. The non-transitory computer-readable storage medium according to claim 1, wherein the outputting includes determining, prior to the comparing of components and wiring lines, which pairs of components to compare, as well as which pairs of wiring lines to compare, based on connections of the components included in the first portion and connection of the components included in the second portion.

4. The non-transitory computer-readable storage medium according to claim 3, wherein the determining includes receiving an input that specifies a pair of components to be compared.

5. The non-transitory computer-readable storage medium according to claim 3, wherein the determining includes receiving an input that specifies a component that is excluded from the comparing.

6. The non-transitory computer-readable storage medium according to claim 1, wherein the locating of data of the first component and second component includes receiving an input from a user which specifies the first component in the reference circuit and the second component in the product circuit.

7. An information processing apparatus comprising:
a memory configured to store data of a reference circuit which is imported into another circuit and data of a product circuit which is designed by using the reference circuit; and a processor configured to perform a procedure including:
locating data of a first component in the reference circuit, as well as data of a second component in the product circuit;

obtaining data of a first portion of the reference circuit by tracing wiring lines from component to component in the reference circuit, with the first component as a start point;

obtaining data of a second portion of the product circuit by tracing wiring lines from component to component in the product circuit, with the second component as a start point; and outputting data indicating differences between the first portion and second portion, based on the obtained data of the first portion and the obtained data of the second portion, wherein the outputting includes:

comparing first attribute values, included in a component table and a net table, of components and wiring lines included in the data of the first portion with second attribute values, included in the component table and the net table, of components and wiring lines included in the data of the second portion; and producing data indicating differences in the components and wiring lines between the first portion and second portion.

8. A design verification method comprising:
locating, by a processor, data of a first component in a reference circuit which is imported into another circuit, as well as data of a second component in a product circuit which is designed by using the reference circuit;

obtaining, by the processor, data of a first portion of the reference circuit by tracing wiring lines from component to component in the reference circuit, with the first component as a start point;

obtaining, by the processor, data of a second portion of the product circuit by tracing wiring lines from component to component in the product circuit, with the second component as a start point; and outputting, by the processor, data indicating differences between the first portion and second portion, based on the obtained data of the first portion and the obtained data of the second portion, wherein the outputting includes:

comparing first attribute values, included in a component table and a net table, of components and wiring lines included in the data of the first portion with second attribute values, included in the component table and the net table, of components and wiring lines included in the data of the second portion; and producing data indicating differences in the components and wiring lines between the first portion and second portion.

* * * * *